US011101115B2

(12) United States Patent
Kopec et al.

(10) Patent No.: US 11,101,115 B2
(45) Date of Patent: Aug. 24, 2021

(54) RING REMOVAL FROM PROCESSING CHAMBER

(71) Applicant: Applied Materials, Inc., Santa Clara, CA (US)

(72) Inventors: Nicholas M. Kopec, Santa Clara, CA (US); Damon K. Cox, Round Rock, TX (US); Andreas Schmid, Meyriez (CH)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 16/824,394

(22) Filed: Mar. 19, 2020

(65) Prior Publication Data

US 2020/0335312 A1 Oct. 22, 2020

Related U.S. Application Data

(60) Provisional application No. 62/836,171, filed on Apr. 19, 2019.

(51) Int. Cl.
*H01J 37/32* (2006.01)
*H01L 21/687* (2006.01)

(52) U.S. Cl.
CPC .. *H01J 37/32807* (2013.01); *H01J 37/32642* (2013.01); *H01L 21/6875* (2013.01);
(Continued)

(58) Field of Classification Search
None
See application file for complete search history.

(56) References Cited

U.S. PATENT DOCUMENTS 5,267,607 A 12/1993 Wada
5,660,673 A 8/1997 Miyoshi
(Continued)

FOREIGN PATENT DOCUMENTS

CN 105336561 A 2/2016
CN 105789010 A 7/2016
(Continued)

OTHER PUBLICATIONS

Taiwan Office Action dated Sep. 20, 2019 for Application No. 106100104 (APPM/23690TW).
(Continued)

*Primary Examiner* — Gerald McClain
(74) *Attorney, Agent, or Firm* — Patterson + Sheridan, LLP

(57) ABSTRACT

A method and apparatus for replacing process kits that include edge rings and/or support rings in processing chambers. In one implementation, a process kit comprises a multi-segment edge ring. The multi-segment edge ring comprises a first segment, a second segment, and a first annular body. The first annular body comprises a first upper surface, a first lower surface opposite the first upper surface, a first inner surface and a first outer surface. The first segment and the second segment are connectable to form the first annular body. The first lower surface is operable to be positioned over a substrate support disposed within a processing chamber, and at least a portion of the inner surface, which is positioned between the first upper surface and the first lower surface has a diameter greater than a diameter of a substrate to be processed in the processing chamber.

20 Claims, 13 Drawing Sheets

(52) U.S. Cl.
CPC .. *H01L 21/68707* (2013.01); *H01L 21/68728* (2013.01); *H01L 21/68735* (2013.01)

(56) References Cited

U.S. PATENT DOCUMENTS

| | | | |
|---|---|---|---|
| 5,730,801 A | 3/1998 | Tepman et al. | |
| 5,762,714 A | 6/1998 | Mohn et al. | |
| 5,851,140 A | 12/1998 | Barns et al. | |
| 5,885,428 A | 3/1999 | Kogan | |
| 6,022,809 A | 2/2000 | Fan | |
| 6,044,534 A | 4/2000 | Seo et al. | |
| 6,206,976 B1 | 3/2001 | Crevasse et al. | |
| 6,375,748 B1 | 4/2002 | Yudovsky et al. | |
| 6,391,787 B1 | 5/2002 | Dhindsa et al. | |
| 6,511,543 B1 | 1/2003 | Stauss et al. | |
| 6,589,352 B1 | 7/2003 | Yudovsky et al. | |
| 6,676,759 B1 | 1/2004 | Takagi | |
| 6,709,547 B1 | 3/2004 | Ni et al. | |
| 6,744,212 B2 | 6/2004 | Fischer et al. | |
| 6,773,562 B1 | 8/2004 | Inagawa et al. | |
| 6,896,765 B2 | 5/2005 | Steger | |
| 6,898,558 B2 | 5/2005 | Klekotka | |
| 7,138,014 B2 | 11/2006 | Stevens et al. | |
| 7,138,067 B2 | 11/2006 | Vahedi et al. | |
| 7,176,403 B2 | 2/2007 | Steger | |
| 7,252,738 B2 | 8/2007 | Tong et al. | |
| 7,311,784 B2 | 12/2007 | Fink | |
| 7,338,578 B2 | 3/2008 | Huang et al. | |
| 7,589,950 B2 | 9/2009 | Parkhe et al. | |
| 7,824,146 B2 * | 11/2010 | Lanee | H01L 21/68721 414/804 |
| 7,968,469 B2 | 6/2011 | Collins et al. | |
| 8,270,141 B2 | 9/2012 | Willwerth et al. | |
| 8,298,371 B2 | 10/2012 | Koshimizu et al. | |
| 8,441,640 B2 | 5/2013 | Patalay et al. | |
| 8,696,878 B2 | 4/2014 | Riker et al. | |
| 8,900,398 B2 | 12/2014 | Dhindsa et al. | |
| 8,933,628 B2 | 1/2015 | Banna et al. | |
| 8,988,848 B2 | 3/2015 | Todorow et al. | |
| 8,999,106 B2 | 4/2015 | Liu et al. | |
| 9,011,637 B2 | 4/2015 | Yamamoto | |
| 9,017,526 B2 | 4/2015 | Singh et al. | |
| 9,076,636 B2 | 7/2015 | Ohata et al. | |
| 9,142,391 B2 | 9/2015 | Yamamoto | |
| 9,287,093 B2 | 3/2016 | Singh et al. | |
| 9,410,249 B2 | 8/2016 | Male et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 9,947,517 B1 | 4/2018 | Luere et al. | |
| 10,103,010 B2 | 10/2018 | Luere et al. | |
| 10,985,078 B2 * | 4/2021 | Kenworthy | H01J 37/32752 |
| 2003/0127433 A1 | 7/2003 | Sirkis et al. | |
| 2003/0173031 A1 | 9/2003 | Aggarwal et al. | |
| 2003/0201069 A1 | 10/2003 | Johnson | |
| 2004/0053428 A1 | 3/2004 | Steger | |
| 2004/0149389 A1 | 8/2004 | Fink | |
| 2004/0261946 A1 | 12/2004 | Endoh et al. | |
| 2005/0061447 A1 | 3/2005 | Kim et al. | |
| 2005/0133164 A1 | 6/2005 | Fischer et al. | |
| 2005/0263070 A1 | 12/2005 | Fink | |
| 2007/0111339 A1 * | 5/2007 | Wege | H01J 37/32642 438/10 |
| 2008/0173237 A1 | 7/2008 | Collins et al. | |
| 2008/0236749 A1 | 10/2008 | Koshimizu et al. | |
| 2008/0289766 A1 | 11/2008 | Heemstra et al. | |
| 2009/0041568 A1 | 2/2009 | Muraoka et al. | |
| 2009/0067954 A1 | 3/2009 | Lanee et al. | |
| 2010/0101729 A1 | 4/2010 | Kim et al. | |
| 2010/0206484 A1 | 8/2010 | Hiromi et al. | |
| 2011/0157760 A1 | 6/2011 | Willwerth et al. | |
| 2011/0287631 A1 | 11/2011 | Yamamoto | |
| 2012/0091108 A1 | 4/2012 | Lin et al. | |
| 2012/0176692 A1 | 7/2012 | Yamawaku et al. | |
| 2012/0256363 A1 | 10/2012 | Okita et al. | |
| 2012/0305184 A1 | 12/2012 | Singh et al. | |
| 2013/0106286 A1 | 5/2013 | Banna et al. | |
| 2013/0149076 A1 | 6/2013 | Cox et al. | |
| 2013/0155568 A1 | 6/2013 | Todorow et al. | |
| 2014/0017900 A1 | 1/2014 | Doba et al. | |
| 2014/0213055 A1 | 7/2014 | Himori et al. | |
| 2014/0265089 A1 | 9/2014 | Tantiwong et al. | |
| 2015/0064809 A1 | 3/2015 | Lubomirsky | |
| 2015/0181684 A1 * | 6/2015 | Banna | H01L 21/6875 438/710 |
| 2015/0200124 A1 | 7/2015 | Yamamoto | |
| 2015/0332951 A1 | 11/2015 | Male et al. | |
| 2016/0042926 A1 | 2/2016 | Ishikawa et al. | |
| 2016/0204019 A1 * | 7/2016 | Ishii | H01L 21/67748 269/296 |
| 2016/0211165 A1 | 7/2016 | McChesney et al. | |
| 2016/0211166 A1 | 7/2016 | Yan et al. | |
| 2016/0240415 A1 | 8/2016 | Sekiya | |
| 2017/0018411 A1 | 1/2017 | Sriraman et al. | |
| 2017/0069462 A1 | 3/2017 | Kanarik et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 | 4/2017 | Genetti et al. | |
| 2017/0133283 A1 * | 5/2017 | Kenworthy | H01J 37/32752 |
| 2017/0178917 A1 | 6/2017 | Kamp et al. | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0278679 A1 | 9/2017 | Angelov et al. | |
| 2017/0287682 A1 | 10/2017 | Musselman et al. | |
| 2017/0287753 A1 | 10/2017 | Musselman et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |
| 2018/0019107 A1 | 1/2018 | Ishizawa | |
| 2018/0061696 A1 | 3/2018 | D'Ambra et al. | |
| 2018/0090354 A1 | 3/2018 | Sugita et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0308737 A1 | 10/2018 | Moriya et al. | |
| 2018/0315583 A1 | 11/2018 | Luere et al. | |
| 2018/0315640 A1 | 11/2018 | Ueda et al. | |
| 2019/0088531 A1 | 3/2019 | Sarode Vishwanath et al. | |
| 2019/0172714 A1 | 6/2019 | Bobek et al. | |

FOREIGN PATENT DOCUMENTS

| | | |
|---|---|---|
| TW | 439093 B | 6/2001 |
| TW | 201324674 A | 6/2013 |
| WO | 2012-134663 A2 | 10/2012 |

OTHER PUBLICATIONS

Chinese Office Action dated May 16, 2019 for Application No. 201822159176.8 (APPM/25669CNU).
Chinese Office Action for Application No. 201821554985.2 dated Feb. 19, 2019 (APPM/25317CNU).
Taiwan Office Action dated Mar. 22, 2019 for Application No. 107217385 (APPM/25669TWU).
Bracelet Holder Vise Clamp Stone Prong Pave Channel Setting Setter. Prolinemax, www.prolinemax.com/; Bracelet-Holder-Vise-Clamp-Stone-Prong-Pave-Channel-Setting-Setter-_p_ 1006.html_.
International Search Report and Written Opinion dated Apr. 24, 2017 for Application No. PCT/US2016/069449 (APPM/023690PC).

(56) References Cited

OTHER PUBLICATIONS

Office Action for U.S. Appl. No. 16/222,831 (APPM/025669US) dated Oct. 15, 2019.
International Search Report and Written Opinion for International Application No. PCT/US2020/023699 (APPM/44016384WO01) dated Jul. 10, 2020.

* cited by examiner

RING REMOVAL FROM PROCESSING CHAMBER

CROSS-REFERENCE TO RELATED APPLICATIONS

This application claims benefit of U.S. provisional patent application Ser. No. 62/836,171, filed Apr. 19, 2019, which is incorporated herein by reference in its entirety.

BACKGROUND

Field

The present disclosure generally relates to apparatus and methods for replacing process kits that include edge rings and/or support rings in processing chambers, such as processing chambers used in semiconductor processing.

Description of the Related Art

In processing chambers, such as etch chambers; substrates are etched while electrostatically clamped in position. Typically, one or more circular parts, referred to as edge rings, processing rings, support rings and the like, are positioned around the outer diameter of the substrate to protect the upper surface of the electrostatic chuck from being etched by etchant chemistry or to facilitate processing of a substrate. These rings are made from several different materials and can have different shapes, both of which affect process uniformity near the substrate perimeter. During processing, these rings are etched over time thereby resulting in shape changes as well as changes in processing uniformity.

To address the changes in processing uniformity due to deterioration, these rings are changed according to a schedule. Conventionally, to replace one of these rings, processing chambers are opened to allow an operator to have access to the ring inside. However, this process is time consuming, and due to cleaning and pumping down of the processing chamber can take up to twenty-four hours to return the processing chamber to a state ready for production.

Therefore, there is a need for new methods and apparatuses for replacing consumable components within a processing chamber.

SUMMARY

The present disclosure generally relates to apparatus and methods for replacing process kits that include edge rings and/or support rings in processing chambers, such as processing chambers used in semiconductor processing. In one aspect, a process kit for use in a processing chamber is provided. The process kit comprises a multi-segment edge ring. The multi-segment edge ring includes a first segment, a second segment, and a first annular body. The first annular body includes a first upper surface, a first lower surface opposite the first upper surface, a first inner surface and a first outer surface. The first segment and the second segment are connectable to form the first annular body. The first lower surface is operable to be positioned over a substrate support disposed within a processing chamber, and at least a portion of the inner surface, which is positioned between the first upper surface and the first lower surface has a diameter greater than a diameter of a substrate to be processed in the processing chamber.

In another aspect, a method of removing a multi-segment edge ring is provided. The method includes elevating the multi-segment edge ring from a position in which the multi-segment edge ring is disposed adjacent to a substrate support disposed within a processing chamber that is maintained at a vacuum pressure. The method further includes inserting a robot blade with a carrier plate disposed thereon into the processing chamber. The robot blade is coupled to a transfer robot. The method further includes separating the multi-segment edge ring into segments including at least a first segment and a second segment. The method further includes transferring the first segment of the multi-segment edge ring onto the carrier plate. The method further includes removing the first segment of the multi-segment edge ring and the carrier plate from the processing chamber by use of the transfer robot, while the processing chamber is maintained at the vacuum pressure.

In yet another aspect, a method of removing a process kit is provided. The method includes elevating a multi-segment edge ring and a support ring stack from a position in which the support ring stack is disposed over a surface of a substrate support disposed within a processing chamber, where a bottom surface of the support ring stack is positioned over at least a portion of a top surface of the multi-segment edge ring. The method further includes inserting a robot blade with a carrier ring disposed thereon into the processing chamber, wherein the robot blade is coupled to a transfer robot. The method further includes transferring the support ring stack onto the carrier ring. The method further includes removing the support ring stack, the carrier ring, and the robot blade from the processing chamber by use of the transfer robot. The method further includes inserting the robot blade with a carrier plate disposed thereon into the processing chamber. The method further includes separating the multi-segment edge ring into segments including at least a first segment and a second segment. The method further includes transferring the first segment of the multi-segment edge ring onto the carrier plate. The method further includes removing the first segment of the multi-segment edge ring and the carrier plate from the processing chamber by use of the transfer robot.

In yet another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, can be had by reference to implementations, some of which are illustrated in the appended drawings. It is to be noted, however, that the appended drawings illustrate only typical implementations of this disclosure and are therefore not to be considered limiting of its scope, for the disclosure can admit to other equally effective implementations.

Figure 1A:
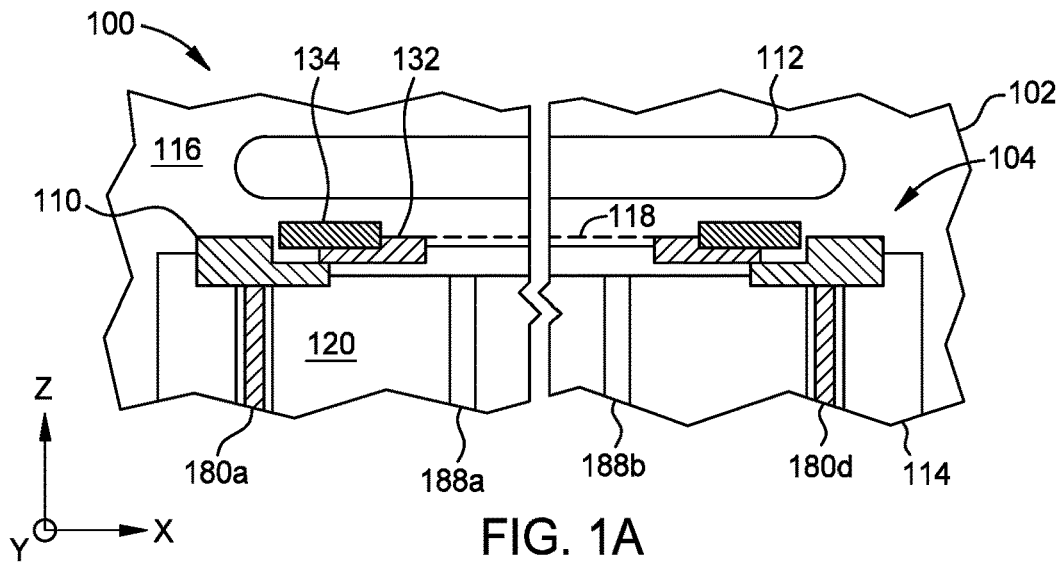
FIGS. 1A-1J illustrate partial schematic views of a processing chamber during removal of a ring therefrom, according to one or more implementations of the present disclosure.

To facilitate understanding, identical reference numerals have been used, where possible, to designate identical elements that are common to the figures. It is contemplated that elements and features of one implementation can be beneficially incorporated in other implementations without further recitation.

DETAILED DESCRIPTION

The following disclosure describes apparatus and methods for replacing process kits that include edge rings, support rings, and/or other rings in processing chambers. Certain details are set forth in the following description and in FIGS. 1A-9B to provide a thorough understanding of various aspects of the disclosure. Other details describing well-known structures and systems often associated with process kit replacement and semiconductor processing are not set forth in the following disclosure to avoid unnecessarily obscuring the description of the various aspects.

Many of the details, dimensions, angles and other features shown in the Figures are merely illustrative of particular aspects. Accordingly, other aspects can have other details, components, dimensions, angles and features without departing from the spirit or scope of the present disclosure. In addition, further aspects of the disclosure can be practiced without several of the details described below.

Aspects described herein will be described below in reference to a ring replacement process that can be carried out in a processing system without breaking vacuum. Exemplary processing systems include but are not limited to PRODUCER® Etch and CENTRIST™ SYM3™ systems available from Applied Materials, Inc. of Santa Clara, Calif. Other tools capable of performing ring replacement processes can also be adapted to benefit from the aspects described herein. In addition, any system enabling the ring replacement processes described herein can be used to advantage. The apparatus description described herein is illustrative and should not be construed or interpreted as limiting the scope of the aspects described herein.

Implementations can include one or more of the following potential advantages. The methods and apparatuses of the present disclosure can improve the etch rate uniformity across a surface of a substrate by controlling the shape of a plasma sheath formed across a substrate, such as a semiconductor wafer, during plasma processing. Process kit hardware that is in close proximity to a substrate and/or supports the substrate during processing can be replaced without venting the processing chamber. Consumable parts within the process kit hardware can be replaced while the remaining parts of the process kit hardware are reused for longer periods of time without venting the processing chamber. The consumable parts, which become eroded or attacked during plasma processing, are typically replaced after a much shorter period of time, such as about a hundred substrates to about a few thousand substrates that are processed within the processing chamber. The replacement of the consumable parts can be completed using an automated method of swapping used parts without venting the processing chamber. Stated differently, the processing chamber is maintained under vacuum while the ring is replaced. Thus, the overall cost for plasma processing in the processing chamber is reduced.

As an initial matter, in the following description, an orthogonal coordinate system including an X-axis, a Y-axis, and a Z-axis is used to help describe the relative orientation of the various described components, and is not intended to be limiting as to the scope of the disclosure provided herein.

FIGS. 1A-1J illustrate partial schematic views of a processing chamber 100 during removal of a process kit 104 that includes a multi-segment edge ring 110 therefrom, according to one or more aspects of the present disclosure. While conventional processing chambers require venting to atmospheric pressure before their lids can be opened by an operator to replace eroded components such as the multi-segment edge ring 110, the processing chamber 100 is operable to facilitate replacement of the multi-segment edge ring 110 without venting and opening of the lid of the processing chamber 100. Opening of the processing chamber 100 is avoided by transferring segments or portions of the multi-segment edge ring 110 through a substrate access port 112 of the processing chamber 100.

The processing chamber 100 can be any of an etch chamber, deposition chamber (including atomic layer deposition, chemical vapor deposition, physical vapor deposition, or plasma enhanced versions thereof), anneal chamber, and the like, which utilizes a substrate support assembly 114 therein.

The processing chamber 100 includes a chamber body 102 that defines a processing region 116. The processing chamber 100 includes the substrate support assembly 114 positioned in the processing region 116 for receiving a substrate 118 thereon. The processing chamber 100 further includes the substrate access port 112 for ingress and egress of the substrate 118 to and from the processing region 116. The process kit 104 is positioned on the substrate support assembly 114 and surrounds an outer edge of the substrate 118. While not intending to limit the scope of the disclosure provided herein, in some aspects in which the substrate 118 is circular in shape, the process kit 104 is substantially axially symmetric about a central vertical axis, which is aligned with the Z-direction, passing through a center of the substrate 118.

The substrate support assembly 114 includes, for example, an electrostatic chuck, referred to as puck 122, to facilitate chucking of substrates onto an upper surface of the substrate support assembly 114. The substrate support assembly 114 can include additional components, such as, for example, grounding plates, cooling plates, and facilities plates, which are not shown in FIGS. 1A-1J for the sake of brevity.

A first plurality of lift pins 180a-e (collectively 180) (shown in FIGS. 4A-4F) are disposed in respective openings positioned circumferentially around the puck 122 and extending through the electrostatic chuck base 120. Each of the lift pins 180a-e can vertically actuate independently from one another via actuators (not shown), such as stepper motors or linear actuators, among others. The first plurality of lift pins 180a-e are positioned to raise and lower the multi-segment edge ring 110. In one example, five lift pins are used to engage the multi-segment edge ring 110. Although five lift pins 180a-e are shown, it should be appreciated that any number of lift pins sufficient to raise and lower the multi-segment edge ring 110 can be used.

A second plurality of lift pins 188a, 188b (collectively 188) are located radially inward of the first plurality of lift pins 180. In one example, the second plurality of lift pins 188 includes three lift pins. The lift pins 188 are utilized to raise and lower the substrate 118 from the puck 122 to facilitate robotic transfer of the substrate 118 to and from the substrate support assembly 114.

Figure 1B:
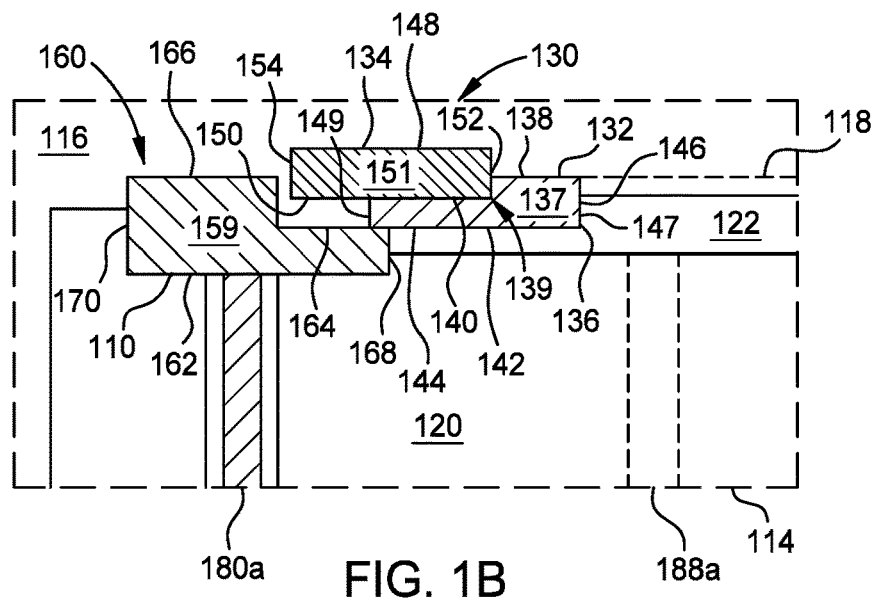

FIG. 1B is a partial enlarged view of a portion of FIG. 1A showing a left side edge of the process kit 104 disposed on the substrate support assembly 114. In some aspects, as shown in FIG. 1B, the substrate support assembly 114 includes an electrostatic chuck base 120 having the puck 122 disposed thereon. The puck 122 is surrounded by the process kit 104. In some aspects, the puck 122 is formed from alumina or aluminum oxide. The substrate 118 (shown in phantom), such as a 200-mm, 300-mm, or 450-mm semiconductor wafer, can be positioned on the puck 122, and secured thereto via electrostatic chucking, to facilitate processing of the substrate 118 in the processing region 116 of the processing chamber 100.

The process kit 104 includes the multi-segment edge ring 110 and a support ring stack 130. The multi-segment edge ring 110 can be positioned in the X-Y plane (e.g., horizontal plane) concentrically around the puck 122 and electrostatic chuck base 120 and protect the puck 122 and electrostatic chuck base 120. In one example, the multi-segment edge ring 110 is fabricated from a conductive material, such as aluminum, aluminum alloys, silicon, silicon carbide (SiC), or other suitable material. The conductive material can be more electrically conductive than the support ring stack 130.

The support ring stack 130 is positioned around the puck 122. The support ring stack 130 includes an inner ring 132 and a middle ring 134. The inner ring 132 and the middle ring 134 can be each separately fabricated from a conductive material, such as aluminum, aluminum alloys, silicon, silicon carbide (SiC), or an insulating material such as quartz. The inner ring 132 contacts the puck 122. The inner ring 132 rests in a stepped surface 136 formed at the radially-outward and upper edge of the puck 122. The inner ring 132 has an annular body 137 surrounding the substrate 118. The annular body 137 of the inner ring 132 includes a stepped upper surface 139 having a radially inward portion 138 and a radially outward portion 140. The radially inward portion 138 is raised above the radially outward portion 140. A lower surface 142 of the inner ring 132 is parallel to both the radially inward portion 138 and the radially outward portion 140. The annular body 137 of the inner ring 132 further includes a radially inward sidewall 146 and a radially outward sidewall 149. In one example, the lower surface 142 is in contact with a lower portion 144 of the stepped surface 136 formed in the puck 122. In another example, the lower surface 142 is in contact with the lower portion 144 of the stepped surface 136 formed in the puck 122, and additionally, a radially inward sidewall 146 of the inner ring 132 is in contact with a vertical edge 147 of the stepped surface 136 formed around the puck 122.

The middle ring 134 has an annular body 151 surrounding the substrate 118. The annular body 151 of the middle ring 134 includes a planar upper surface 148 and a planar lower surface 150, generally parallel to one another. The planar lower surface 150 of the middle ring 134 contacts the radially outward portion 140 of the inner ring 132. The annular body 151 of the middle ring 134 includes a radially inward sidewall 152 and a radially outward sidewall 154. The radially inward sidewall 152 contacts the stepped upper surface 139 of the inner ring 132.

The multi-segment edge ring 110 has an annular body 159 positioned on the substrate support assembly 114. The annular body 159 of the multi-segment edge ring 110 includes an upper surface 160 and a planar lower surface 162 opposite the upper surface 160. As illustrated in FIG. 1B, the upper surface 160 is a stepped surface. The upper surface 160 has a radially inward portion 164 and a radially outward portion 166. The radially outward portion 166 is raised above the radially inward portion 164. The planar lower surface 162 of the multi-segment edge ring 110 is parallel to both the radially inward portion 164 and the radially outward portion 166. Alternatively, the upper surface 160 can be a planar surface. The annular body 159 of the multi-segment edge ring 110 further includes a radially inward sidewall 168 and a radially outward sidewall 170. In one example, the planar lower surface 162 of the multi-segment edge ring 110 is in contact with the electrostatic chuck base 120. In another example, the planar lower surface 162 is in contact with the electrostatic chuck base 120, and additionally, the radially inward sidewall 168 of the multi-segment edge ring 110 is in contact with the vertical edge 147 of the stepped surface 136 formed around the puck 122.

It should be noted that the particular process kit configuration examples described herein are just some possible examples of an edge ring and a support ring stack according to the present disclosure and do not limit the possible configurations, specifications, or the like of the edge ring and the support ring stack according to the present disclosure. For example, shapes or sizes of the edge ring and the support ring stack are not limited to the examples described above. In some implementations, the edge ring can be replaced by multiple edge rings. For example, in some implementations, the edge ring includes an upper edge ring and a lower edge ring stacked on top of each other. The upper edge ring can be fabricated from a plasma resistive material such as silicon or silicon carbide for protection against a direct plasma exposure. The lower edge ring can be fabricated from a material such as quartz, aluminum, or aluminum alloys. In some implementations, the support ring stack includes a single ring.

During processing, an upper end of the lift pin 180a can engage the planar lower surface 162 of the multi-segment edge ring 110 to elevate the multi-segment edge ring 110 from the electrostatic chuck base 120. Elevation of the multi-segment edge ring 110 can be used to adjust a plasma sheath adjacent a radially outward edge of the substrate 118, for example, by compensating for erosion of the multi-segment edge ring 110. In one example, the multi-segment edge ring 110 can be elevated a distance of up to about 2 millimeters (mm). However, after a certain amount of time, the multi-segment edge ring 110 can be eroded to a point in which it is desirable to replace the multi-segment edge ring 110. Aspects of the present disclosure facilitate removal and replacement of the multi-segment edge ring 110 through the substrate access port 112, so that disassembly of the processing chamber 100 is unnecessary for multi-segment edge ring 110 replacement.

As illustrated in FIG. 1B, an inner diameter of the multi-segment edge ring 110 is defined by the radially inward sidewall 168 of the multi-segment edge ring 110 and is less than the outer diameter defined by radially outward sidewall 149 of the inner ring 132. In addition, the inner diameter for the multi-segment edge ring 110 is less than an outer diameter of the middle ring 134, which is defined by the radially outward sidewall 154 of the multi-segment edge ring 110. An outer diameter of the multi-segment edge ring 110 defined by the radially outward sidewall 170 of the multi-segment edge ring 110 is also greater than a width of the substrate access port 112. Moreover, the outer diameter of the multi-segment edge ring 110 defined by radially outward sidewall 170 of the multi-segment edge ring 110 is greater than the outer diameter of the inner ring 132 and the outer diameter of the middle ring 134.

Figure 1C:
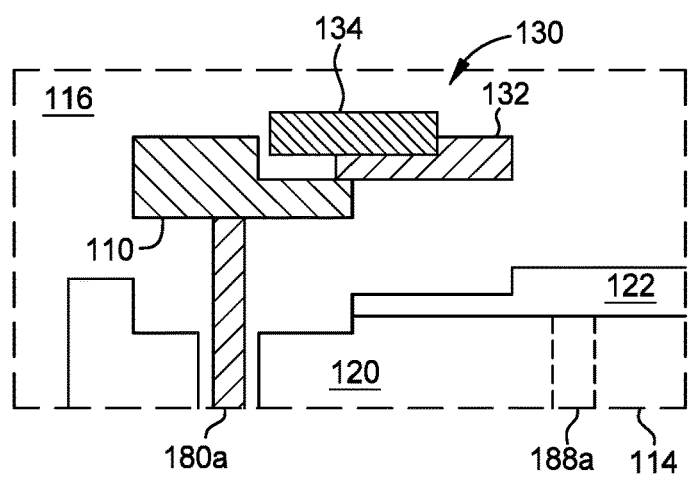
Figure 1D:
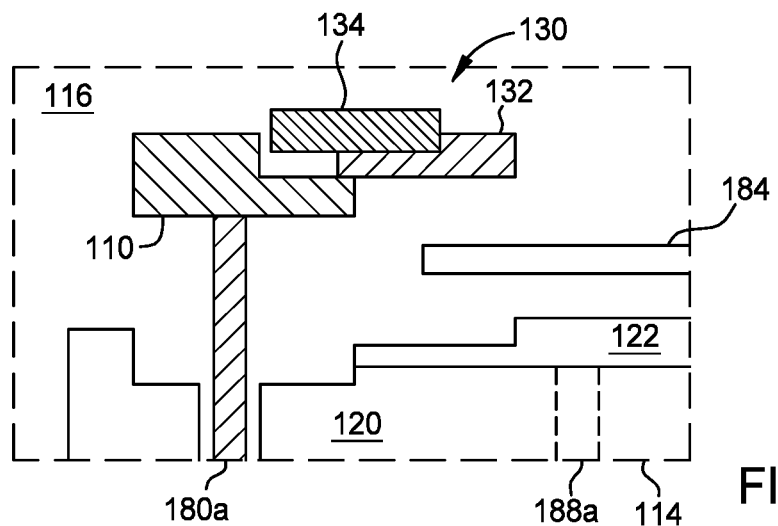

For removal of the support ring stack 130, and with reference to FIG. 1C, the multi-segment edge ring 110 and the support ring stack 130 are elevated by the lift pins 180a, 180d to a height above the substrate access port 112 to provide clearance for receiving a carrier 184 (shown in FIG. 1D) beneath the multi-segment edge ring 110 and the support ring stack 130. The carrier 184 can be a carrier plate or carrier ring, among others. The carrier 184 is sized to support the support ring stack 130 without contacting the multi-segment edge ring 110. For example, in some implementations, the carrier 184 has an outer diameter that is less than an inner diameter represented by the radially inward sidewall 168 of the of the multi-segment edge ring 110. The carrier 184 is positioned beneath the support ring stack 130 by a robot blade, end effector, or the like (not shown for clarity in FIG. 1D).

Figure 1E:
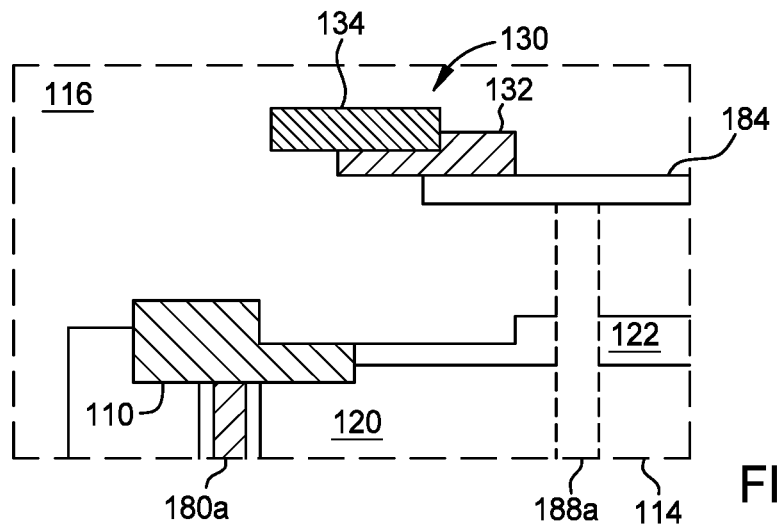

Referring now to FIG. 1E, once the carrier 184 is positioned beneath the support ring stack 130 (e.g., over the substrate support assembly 114 and concentrically aligned therewith), the second plurality of lift pins 188a, 188b actuate vertically upward or extend to lift the carrier 184 from the robot blade (not shown for clarity in FIG. 1E). Once the carrier 184 is lifted, the robot blade is removed from the processing chamber 100. The second plurality of lift pins 188a, 188b are located radially inward of the first plurality of lift pins 180. In one example, three lift pins are utilized to engage and support the carrier 184 above the puck 122.

Figure 1F:
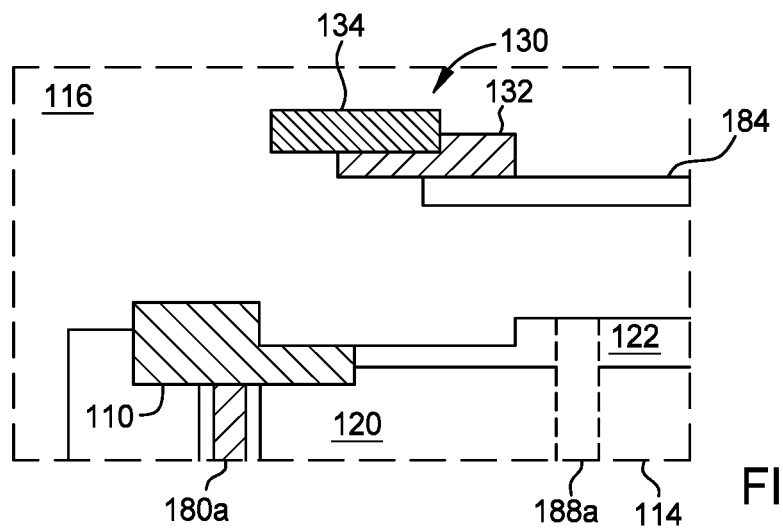
Figure 1G:
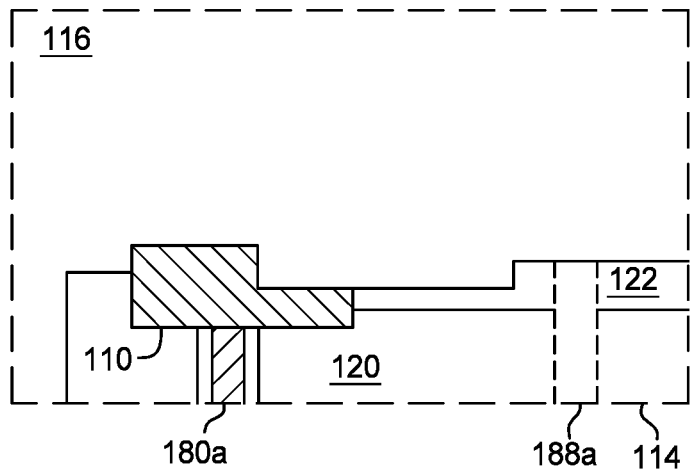

With the carrier 184 supported on the lift pins 188, the lift pins 180a, 180d retract to transfer the support ring stack 130 to the carrier 184, as shown in FIG. 1E. The lift pins 180a, 180d having the multi-segment edge ring 110 supported thereon continue to retract into the substrate support assembly 114 while the support ring stack 130 remains on the carrier 184, as shown in FIG. 1F. With the lift pins 180a, 180d recessed into the substrate support assembly 114, the lift pins 188a, 188b are elevated upwards to raise the carrier 184 and the support ring stack 130, as shown in FIG. 1F. The lift pins 188a, 188b are elevated to a height sufficient to allow ingress of the robot blade (not shown) into the processing chamber 100 between the carrier 184 and the puck 122. The robot blade is positioned beneath the carrier 184 and the support ring stack 130, to facilitate placement of the carrier 184 onto the robot blade.

Once the robot blade is positioned beneath the carrier 184, the lift pins 188a, 188b retract to position the carrier 184 onto the robot blade. Additional downward movement of the lift pins 188a, 188b eliminates interference between the robot blade and the lift pins 188a, 188b. With the lift pins 188a, 188b clear of the robot blade, the robot blade, as well as the carrier 184, and the support ring stack 130, are ready to be removed from the processing chamber 100 through the substrate access port 112. Subsequently, the carrier 184 is moved through the substrate access port 112 on the robot blade, and transferred according to the example of FIG. 5. It is contemplated that a new support ring stack can be introduced into the processing chamber 100 by reverse operation.

FIGS. 1A-1F illustrate one example of a support ring stack removal process. However, other examples are also contemplated. For example, with reference to FIG. 1E, it is contemplated that the support ring stack 130 can be lowered onto the carrier 184 while the carrier 184 is supported on the robot blade. The lift pins 188a, 188b can then retract to provide clearance, and the robot having the carrier 184 and the support ring stack 130 thereon can be removed from the processing chamber 100 through the substrate access port 112.

Next, with reference to FIGS. 1G-1J, the multi-segment edge ring 110 is removed from the processing chamber 100. As discussed herein, the outer diameter of the multi-segment edge ring 110 is greater than the width of the substrate access port 112. As a result, the multi-segment edge ring 110 is collapsed or broken into separate segments or portions with each segment of the multi-segment edge ring 110 being independently removed from the processing chamber 100 thorough the substrate access port 112. The example shown in FIGS. 1G-1J demonstrates the removal of one segment of the multi-segment edge ring 110. The example shown in FIGS. 1G-1J can be repeated for the subsequent removal of each segment of the multi-segment edge ring 110 through the substrate access port 112.

For removal of the multi-segment edge ring 110, and with reference to FIGS. 1G-1J, the multi-segment edge ring 110, is elevated using the lifts pins 180a, 180d to a height above the substrate access port 112 to provide clearance for receiving a carrier plate 186 (shown in FIG. 1H) beneath the multi-segment edge ring 110. The carrier plate 186 is adapted to contact a segment of the multi-segment edge ring 110 in such a manner as to separate the multi-segment edge ring 110 into segments or portions, which can each be individually removed via the substrate access port 112. The carrier plate 186 is positioned beneath the multi-segment edge ring 110 by a robot blade, end effector, or the like (not shown for clarity in FIGS. 1H-1J).

Figure 1H:
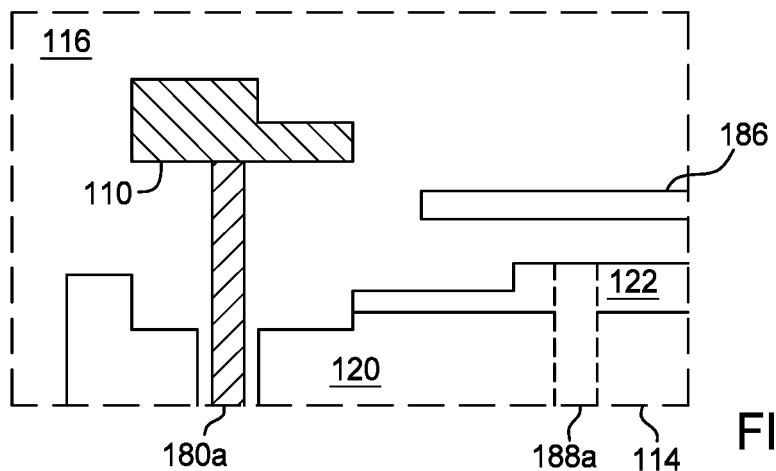
Figure 1I:
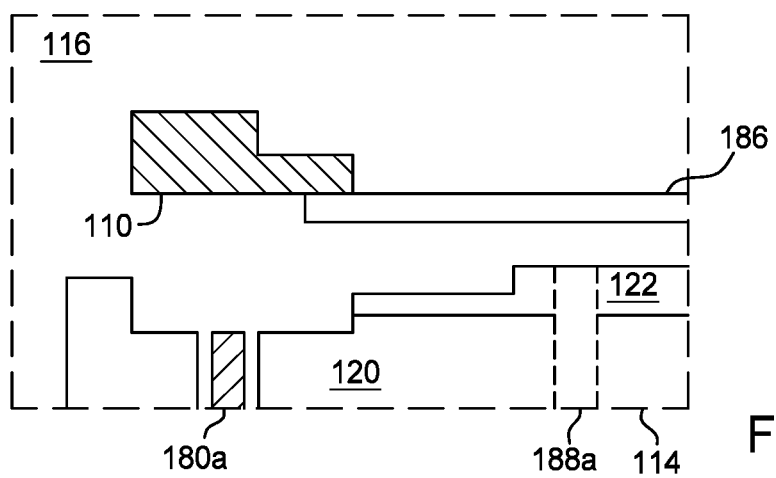
Figure 1J:
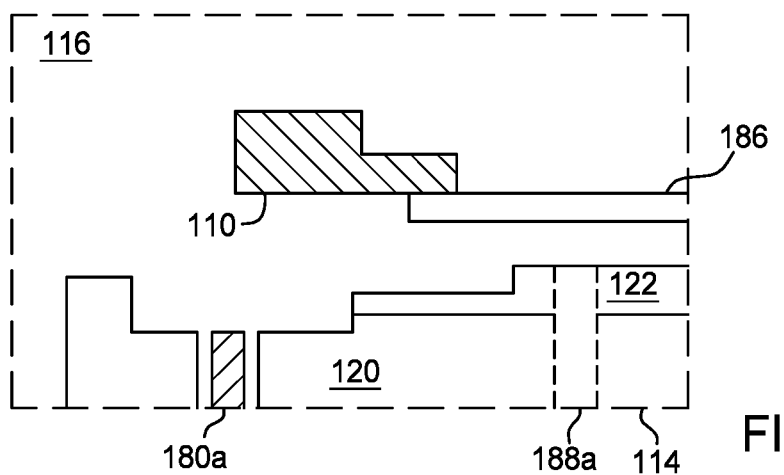

Referring now to FIG. 1I, once the carrier plate 186 is positioned beneath a segment of the multi-segment edge ring 110, the lift pins 180a, 180d actuate vertically downward to position the segment of the multi-segment edge ring 110 on the carrier plate 186, which is support by the robot blade (not shown for clarity in FIG. 1I). The segment of the multi-segment edge ring 110, the carrier plate 186 and the robot blade is moved through the substrate access port 112 on the robot blade. It is contemplated that a new edge ring can be introduced into the processing chamber 100 by reverse operation.

Figure 2:
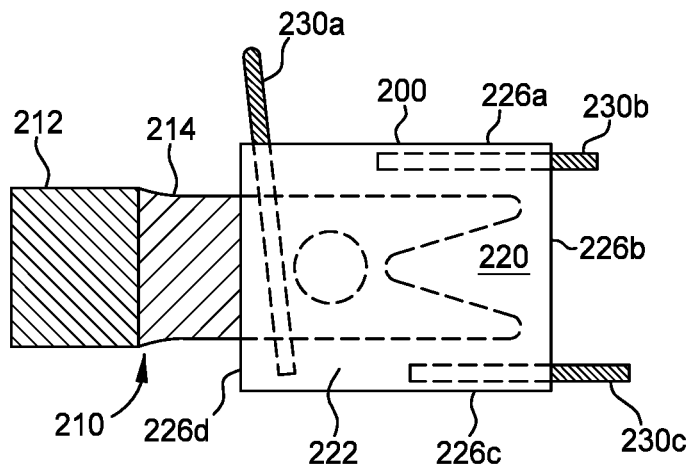
FIG. 2 illustrates a schematic top view of a carrier positioned on a robot blade, according to one or more implementations of the present disclosure.

FIG. 2 illustrates a schematic top view a carrier plate 200 positioned on a transfer robot 210, according to one or more implementations of the present disclosure. The carrier plate 200 is operable to remove a segment of an edge ring, such as the multi-segment edge ring 110 from a processing chamber, such as the processing chamber 100. The carrier plate 200 can be used in place of the carrier plate 186 depicted in FIGS. 1H-1J. The transfer robot 210 includes a robot wrist 212 and a robot blade 214. The robot wrist 212 and the robot blade 214 of the transfer robot 210 are positioned underneath the carrier plate 200 to support a segment of the multi-segment edge ring 110. The robot wrist 212 moves the robot blade 214 both laterally and rotationally to retrieve, transfer, and deliver the segment of the multi-segment edge ring 110 from one location to another within the processing system.

The carrier plate 200 includes a body 220 defined by a support surface 222, a bottom surface 224, and sidewalls 226a-d (collectively 226). The support surface 222 is configured to support at least a segment of the edge ring. The bottom surface 224 is on the side of the body 220 opposite the support surface 222. The bottom surface 224 rests on the robot blade 214. The sidewalls 226a-d connect the support surface 222 with the bottom surface 224 and generally define the thickness of the carrier plate 200. The support surface 222, the bottom surface 224, and thus the body 220, can have a generally polygonal shape, such as a rectangular shape. However, it is contemplated that the body 220 can alternatively have another shape, such as circular.

The carrier plate 200 further includes a plurality of fingers 230a-c (collectively 230) extending from the body 220. Each finger 230 provides a contact point operable to support a segment of the edge ring. Although three fingers are shown, it should be appreciated that any number of fingers 230 suitable to support the segment of the edge ring can be used. Finger 230a extends from sidewall 226a and fingers 230b and 230c extend from sidewall 226b.

When the multi-segment edge ring 110 is to be positioned within or removed from the processing chamber 100, the robot wrist 212 moves the robot blade 214 to the substrate access port 112 of the processing chamber 100, through which the multi-segment edge ring 110 is to be positioned within and removed from the processing chamber 100 without venting the processing chamber 100. Once the used multi-segment edge ring 110 is removed from the processing chamber 100 by the transfer robot, one or more hardware devices are used to unload the segment of the multi-segment edge ring 110 from the carrier plate 200, a new edge ring is loaded on the carrier plate 200, and transferred back into the processing chamber 100 by the robot blade 214 through the substrate access port 112.

Figure 3A:
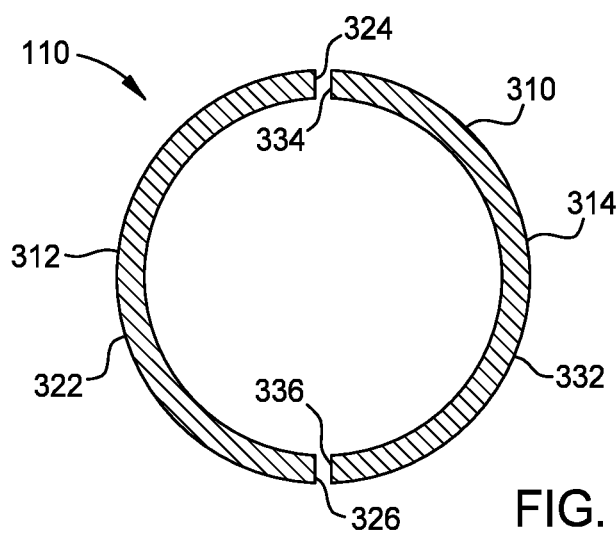
FIG. 3A illustrates a schematic top view of an edge ring, according to one or more implementations described herein.
Figure 3B:
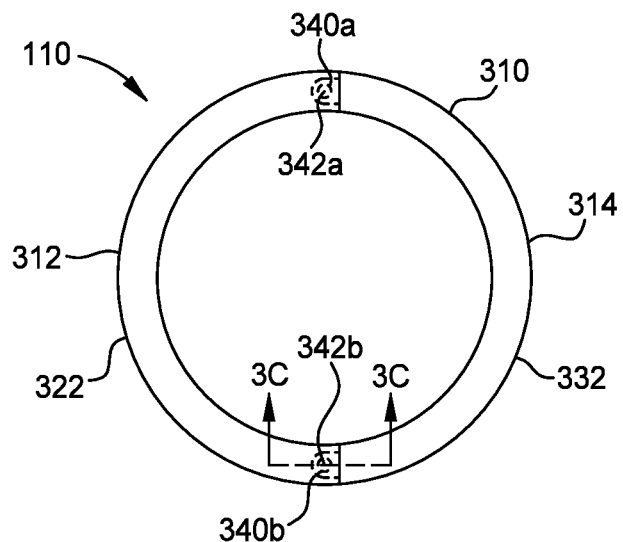
FIG. 3B illustrates a schematic top view of the edge ring of FIG. 3A, according to one or more implementations described herein.
Figure 3C:
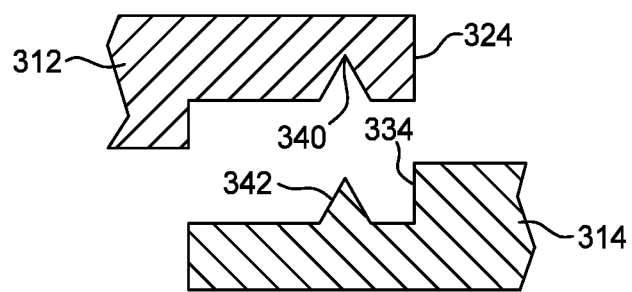
FIG. 3C illustrates a partial cross-sectional view of the edge ring of FIG. 3A, according to one or more implementations described herein.

FIG. 3A illustrates a schematic top view of the multi-segment edge ring 110. FIG. 3B illustrates another schematic top view of the multi-segment edge ring 110 of FIG. 3A. FIG. 3C illustrates a partial cross-sectional view of the multi-segment edge ring 110 taken along line 3C-3C of FIG. 3B. The multi-segment edge ring 110 can be used as depicted in FIGS. 1A-1J. As depicted in FIG. 3C, the multi-segment edge ring 110 includes an annular body 310. The annular body 310 is separable into a first segment 312 and a second segment 314. As depicted in FIG. 3C, the annular body 310 is formed when the first segment 312 and the second segment 314 are interlocked together. The first segment 312 includes a semi-circular body 322 having a first edge 324 and a second edge 326. The second segment 314 includes a semi-circular body 332 having a first edge 334 and a second edge 336. The first segment 312 and the second segment 314 are coupled together at their respective edges to form the annular body 310 as depicted in FIG. 3B.

In one implementation, as shown in FIG. 3C, the first segment 312 and the second segment 314 are coupled together using a slot 340a, 340b (collectively 340) and a key 342a, 342b (collectively 342) to interlock the first segment 312 and the second segment 314. In the partial sectional view of FIG. 3C, the second segment 314 includes the key 342 that engages the slot 340 formed in the first segment 312. The key 342 and the slot 340 interface to interlock the first segment 312 and the second segment 314 together during processing while also allowing the first segment 312 and second segment 314 to be separable from each other. For example, as depicted in FIG. 4E, the first segment 312 and the second segment 314 are separated from each other within the processing chamber 100 by contact from the carrier plate 200. Other interlocking or engaging geometries that maintain the first segment 312 and the second segment 314 together during processing and allow the first segment 312 and the second segment 314 to be separable from each other are also contemplated. In addition, although the multi-segment edge ring 110 is shown as a two-segment ring, it should be understood that the multi-segment edge ring 110 can include more than two segments. For example, in some implementations, the multi-segment edge ring 110 includes three segments (e.g., divided into thirds) or four segments (e.g., divided into quarters), or other number of desirable segments.

FIGS. 4A-4D illustrate schematic top views of various stages of removing a two-segment edge ring, such as multi-segment edge ring 110, from a processing chamber, such as processing chamber 100. In some implementations, as discussed herein, the outer diameter of the multi-segment edge ring 110 is greater than the width of the substrate access port 112. As a result, the multi-segment edge ring 110 is separated into separate segments (e.g., first segment 312 and second segment 314) with each segment of the multi-segment edge ring 110 being independently removed from the processing chamber 100 thorough the substrate access port 112. The example shown in FIGS. 4A-4H demonstrates the removal of a two-segment edge ring. In implementations where the multi-segment edge ring 110 includes more than two segments, the example shown in FIGS. 4A-4H can be modified for subsequent removal of additional segments of the multi-segment edge ring 110 through the substrate access port 112.

Figure 4A:
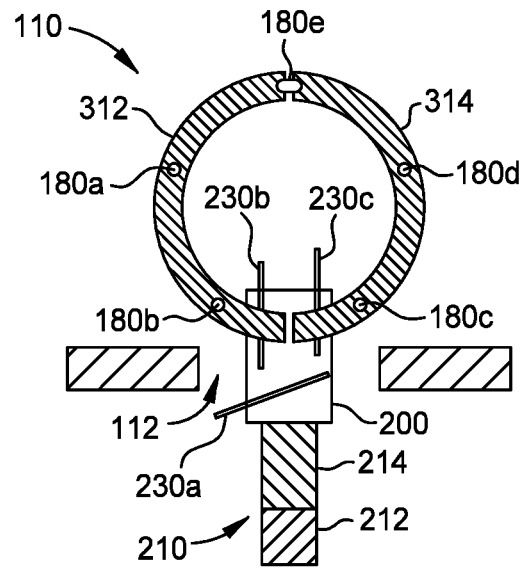
FIGS. 4A-4H illustrate schematic views of various stages of removing a two-segment edge ring from a processing chamber, according to one or more implementations of the present disclosure.
Figure 4B:
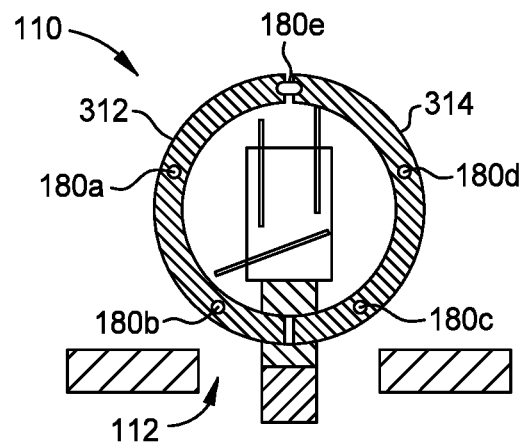

As depicted in FIG. 4A, for removal of the multi-segment edge ring 110, the multi-segment edge ring 110, is elevated using the lifts pins 180a-e to a height above the substrate access port 112 to provide clearance for the carrier plate 200 supported by robot blade 214, beneath the multi-segment edge ring 110. The carrier plate 200 is adapted to contact a segment of the multi-segment edge ring 110 in such a manner as to separate the multi-segment edge ring 110 into the first segment 312 and the second segment 314, which can each be individually removed via the substrate access port 112. As depicted in FIG. 4B, the carrier plate 200 is positioned beneath the multi-segment edge ring 110 by the robot blade 214.

Figure 4C:
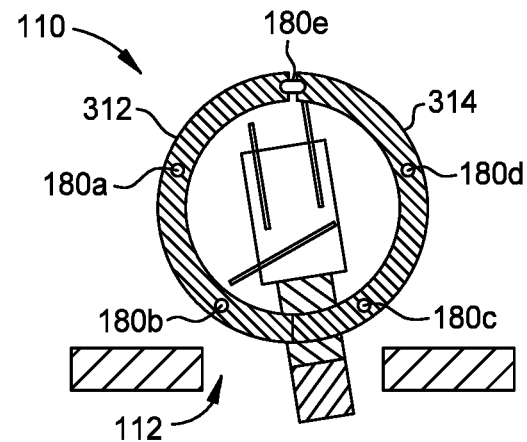
Figure 4D:
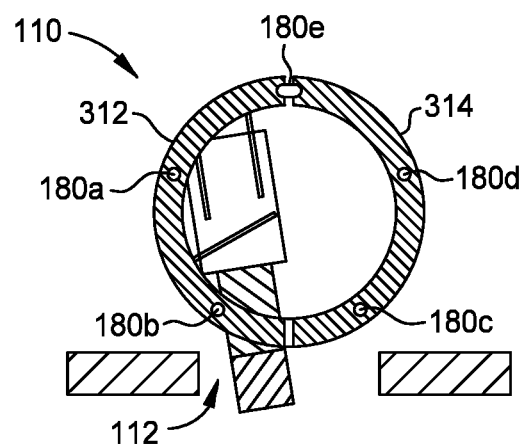
Figure 4E:
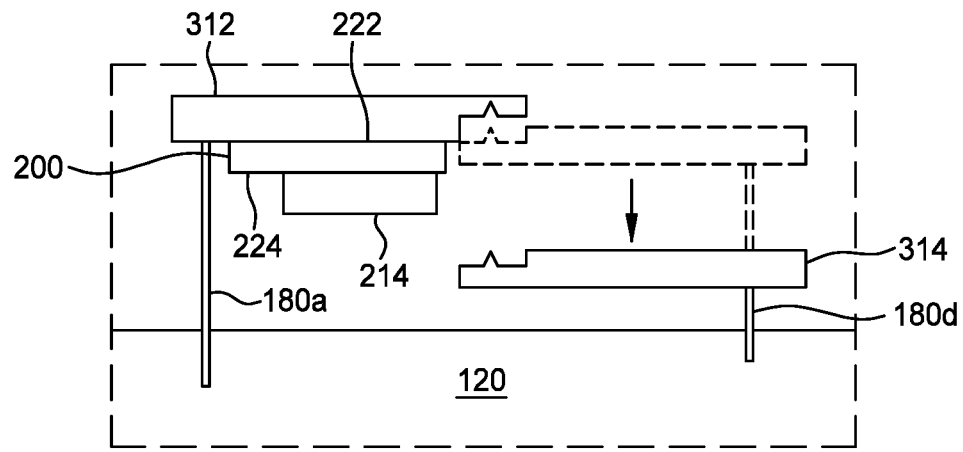

Referring to FIGS. 4C-4D, the transfer robot 210 positions the carrier plate 200 under the segment of the multi-segment edge ring 110 to be removed first from the processing chamber 100, according to one or more implementations of the present disclosure. In the implementation, shown in FIG. 4D, the carrier plate 200 is positioned under the first segment 312 of the multi-segment edge ring 110. In some implementations, the robot blade 214 is raised to contact the first segment 312 of the multi-segment edge ring 110 at three contact points with fingers 230a-c. In some implementations, the lift pins 180a, 180b actuate downward so the first segment 312 of the multi-segment edge ring 110 contacts the robot blade 214 at the three contact points.

FIG. 4E illustrates a schematic side view of the multi-segment edge ring 110 separated into the first segment 312 and the second segment 314 according to one or more implementations of the present disclosure. Once the carrier plate 200 is positioned beneath the first segment 312 of the multi-segment edge ring 110 by the robot blade 214, the lift pins 180a, 180b, and optionally 180e actuate vertically downward to position the first segment 312 of the multi-segment edge ring 110 on the carrier plate 200. The lift pins 180c, 180d, and optionally 180e actuate vertically downward to position the second segment 314 of the multi-segment edge ring 110 adjacent to the electrostatic chuck base 120.

Figure 4F:
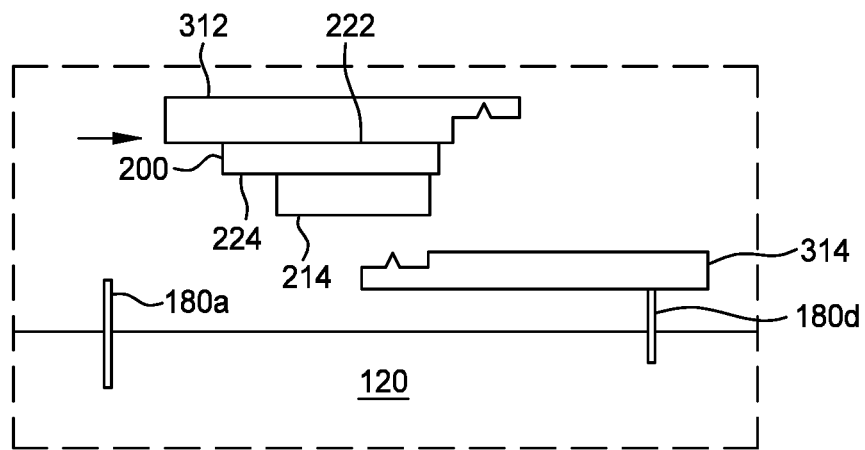
Figure 4G:
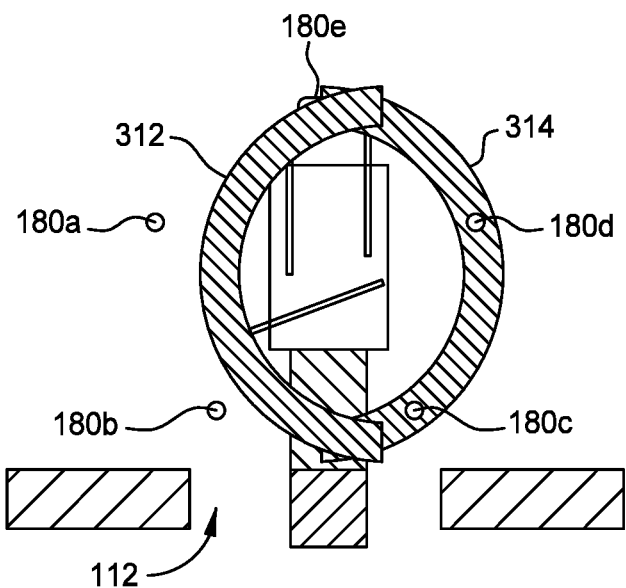

FIG. 4F illustrates a schematic side view of the multi-segment edge ring 110 separated into the first segment 312 and the second segment 314 according to one or more implementations of the present disclosure. FIG. 4G illustrates a schematic top view of the multi-segment edge ring 110 separated into the first segment 312 and the second segment 314 according to one or more implementations of the present disclosure. Referring to FIGS. 4F and 4G, while supported by the robot blade 214, the first segment 312 is centered relative to the substrate access port 112 and positioned above a portion of the second segment 314.

Figure 4H:
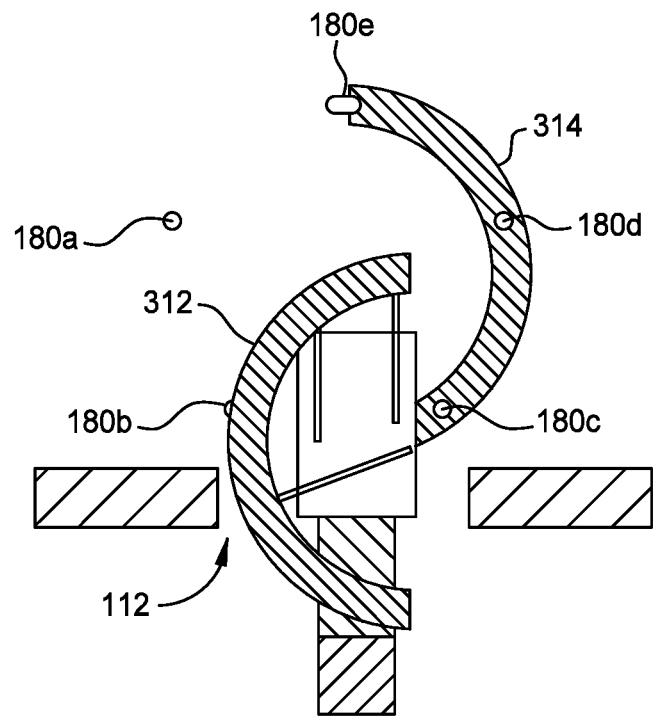

FIG. 4H illustrates a schematic top view of the first segment 312 of the multi-segment edge ring 110 being removed from the processing chamber 100. The first segment 312 is then removed from the processing chamber 100 via the substrate access port 112 by the robot blade 214. The process can be repeated to remove the second segment 314 of the multi-segment edge ring 110 from the processing chamber 100. It is contemplated that a new edge ring can be introduced into the processing chamber 100 by reverse operation.

Figure 5:
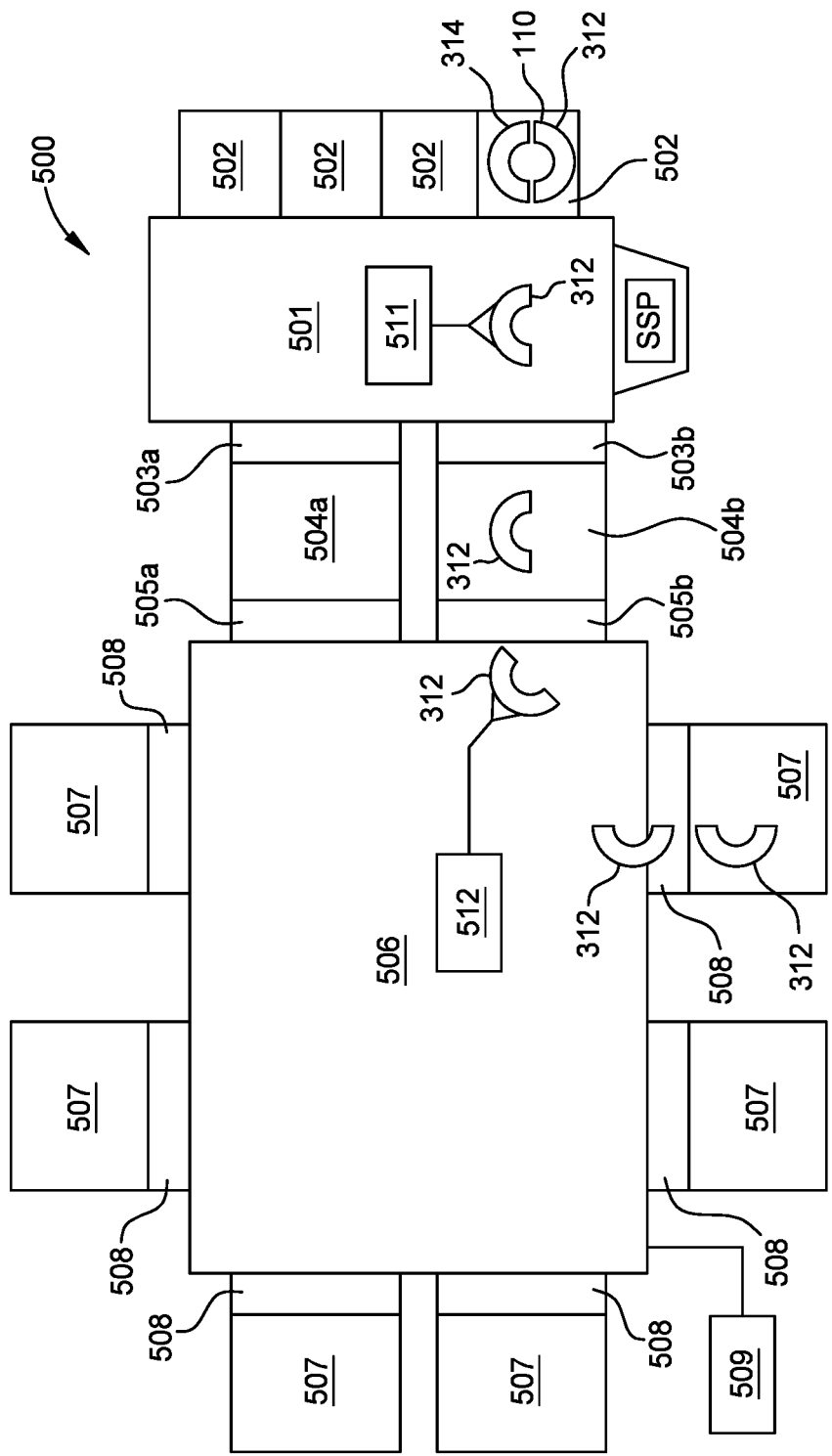
FIG. 5 illustrates a schematic top view of a processing system, according to one or more implementations of the present disclosure.

FIG. 5 illustrates a schematic top view of a processing system 500, according to one or more implementations of the present disclosure. The processing system 500 includes a factory interface 501 to which a plurality of cassettes 502 can be coupled for transferring substrates into the processing system 500. The processing system 500 also includes first vacuum ports 503a, 503b coupling the factory interface 501 to respective load lock chambers 504a, 504b (collectively 504). Second vacuum ports 505a, 505b are coupled to respective load lock chambers 504a, 504b and disposed between the load lock chambers 504a, 504b and a transfer chamber 506 to facilitate transfer of substrates into the transfer chamber 506. The transfer chamber 506 includes a plurality of processing chambers 507 disposed around and coupled to the transfer chamber. Any of the processing chambers 507 can be processing chamber 100 depicted in FIGS. 1A-1J. The processing chambers 507 are coupled to the transfer chamber 506 through respective ports 508 (e.g., slit valves), such as the substrate access port 112 of processing chamber 100.

The processing system 500 further includes a system controller 509 operable to control various aspects of the processing system 500. The system controller 509 facilitates the control and automation of the overall processing chamber 100 and may include a central processing unit (CPU), memory, and support circuits (or I/O). Software instructions and data can be coded and stored within the memory for instructing the CPU. The system controller 509 may communicate with one or more of the components of the processing system 500 via, for example, a system bus. A program (or computer instructions) readable by the system controller 509 determines which tasks are performable on a substrate. In some implementations, the program is software readable by the system controller 509, which can include code to control removal and replacement of the multi-segment edge ring 110. Although shown as a single system controller 509, it should be appreciated that multiple system controllers may be used with the implementations described herein.

FIG. 5 schematically illustrates transfer of a segment of an edge ring, for example, the multi-segment edge ring 110, into a processing chamber 507. The segment of the multi-segment edge ring 110 can be, for example, the first segment 312 and/or the second segment 314 depicted in FIG. 3. According to one implementation of the present disclosure, the segment of the multi-segment edge ring 110 is removed from one of the plurality of cassettes 502 via factory interface robot 511 located in the factory interface 501, or alternatively, is loaded directly into the factory interface 501. The factory interface robot 511 transfers the segment of the multi-segment edge ring 110 through one of the first vacuum ports 503a, 503b and into a respective load lock chamber 504a, 504b. A transfer chamber robot 512 located in the transfer chamber 506 removes the multi-segment edge ring 110 from one of the load lock chambers 504a, 504b through a second vacuum port 505a or 505b. The transfer chamber robot 512 can include segments of the transfer robot 210, such as the robot wrist 212 and the robot blade 214. The transfer chamber robot 512 moves the segment of the multi-segment edge ring 110 into the transfer chamber 506, where the segment of the multi-segment edge ring 110 can be transferred to the desired processing chamber 507 through a respective port 508. While not shown for clarity in FIG. 5, transfer of the segment of the multi-segment edge ring 110 occurs while the segment of the multi-segment edge ring 110 is positioned on a carrier, such as the carrier plate 200. Removal of the segment of the multi-segment edge ring 110 from the processing chamber 507 occurs in reverse order.

FIG. 5 illustrates one example of edge ring transfer, however, other examples are also contemplated. For example, it is contemplated that the segment of the multi-segment edge ring 110 can be manually loaded into the transfer chamber 506. From the transfer chamber 506, the segment of the multi-segment edge ring 110 can be loaded into a processing chamber 507 by the transfer chamber robot 512. Additionally or alternatively, edge rings can be loaded in a support unit. An additional support unit can be positioned in communication with the factory interface 501 opposite the illustrated support unit. When utilizing two support units or multiple cassettes 502, it is contemplated that one side-storage pod ("SSP") or cassette 502 can be used for segments of unprocessed multi-segment edge rings 110, while another support unit or cassette 502 can be used for receiving segments of processed multi-segment edge rings 110. Benefits described herein include removal of chamber hardware without disassembly of a chamber. Thus, preventative maintenance can be performed with reduced downtime.

While FIG. 5 illustrates the transfer of a multi-segment edge ring, for example, the multi-segment edge ring 110 through a processing system 500, it is contemplated that other consumable parts, such as process rings, support rings, and the like, can be transferred in a similar manner.

Figure 6:
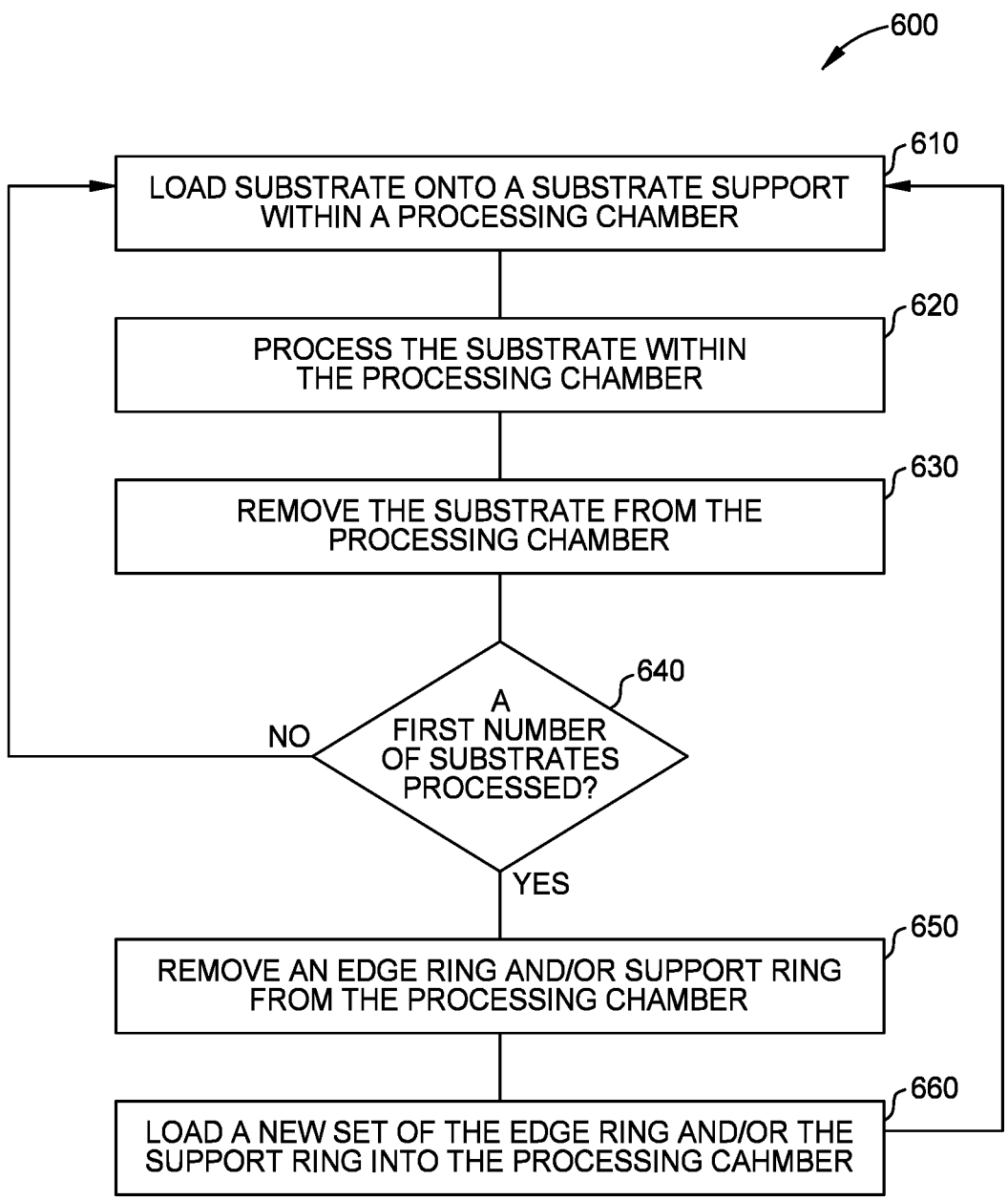
FIG. 6 illustrates a flow chart of a method, according to one or more implementations of the present disclosure.

FIG. 6 illustrates a flow chart of a method 600, according to one or more implementations of the present disclosure. The method 600 will be discussed in conjunction with FIGS. 1A-1J, 2, and 3 to further describe the processes for processing substrates in the processing chamber 100.

The method 600 starts at operation 610 by loading a semiconductor substrate, such as the substrate 118 shown in FIG. 1A, via an entry port, such as substrate access port 112 onto the substrate support assembly 114 disposed within the processing region 116 of the processing chamber 100, as shown in FIG. 1A. A process kit, such as process kit 104, is positioned on the substrate support assembly 114 and surrounds the outer edge of the substrate 118. The process kit 104 includes the multi-segment edge ring 110 and the support ring stack 130. Suitable processing chambers can include an inductively coupled plasma etch chamber, or the like.

At operation 620, the substrate 118 disposed on the substrate support assembly 114 is processed within the processing region 116 of the processing chamber 100. During processing of the substrate 118, segments of the process kit 104, including, for example, the multi-segment edge ring 110, the inner ring 132, and the middle ring 134 are exposed to plasma, which can degrade the process kit components.

After processing the substrate 118, at operation 630, the substrate 118 is elevated by a substrate lift pin, such as the second plurality of lift pins 188 (shown in FIG. 1A), which is controlled by a substrate lift servomotor (not shown), and removed from the processing region 116 of the processing chamber 100 by a robot blade, such as robot blade 214 via the substrate access port 112.

At operation 640, it is determined whether or not a first number of substrates (e.g., 10, 1000 or even 10,000 substrates) have been processed within the processing region 116 of the processing chamber 100. If it is determined at operation 640 that "no" the number has not been reached (e.g., less than the first number of substrates have been processed), the process then returns to operation 640 so that another substrate 118 can be processed within the processing chamber 100. If it is determined at operation 640 that "yes" the number has been reached (e.g., the first number of substrates have been processed), at operation 650, the multi-segment edge ring 110 and the support ring stack 130 are removed from the processing region 116 of the processing chamber 100 via the substrate access port 112 without venting the processing chamber 100 and transferred to a storage unit, such as cassette 502 (shown in FIG. 5). The processes performed at operation 650 include at least operations 810-880, which are shown in FIG. 8, and optionally operations 710-780, which are shown in FIG. 7.

At operation 660, a new set of the multi-segment edge ring 110 and/or the support ring stack 130 are loaded into the processing region 116 of the processing chamber 100. Operations 610 through 660 can all be performed without venting the processing chamber 100.

Figure 7:
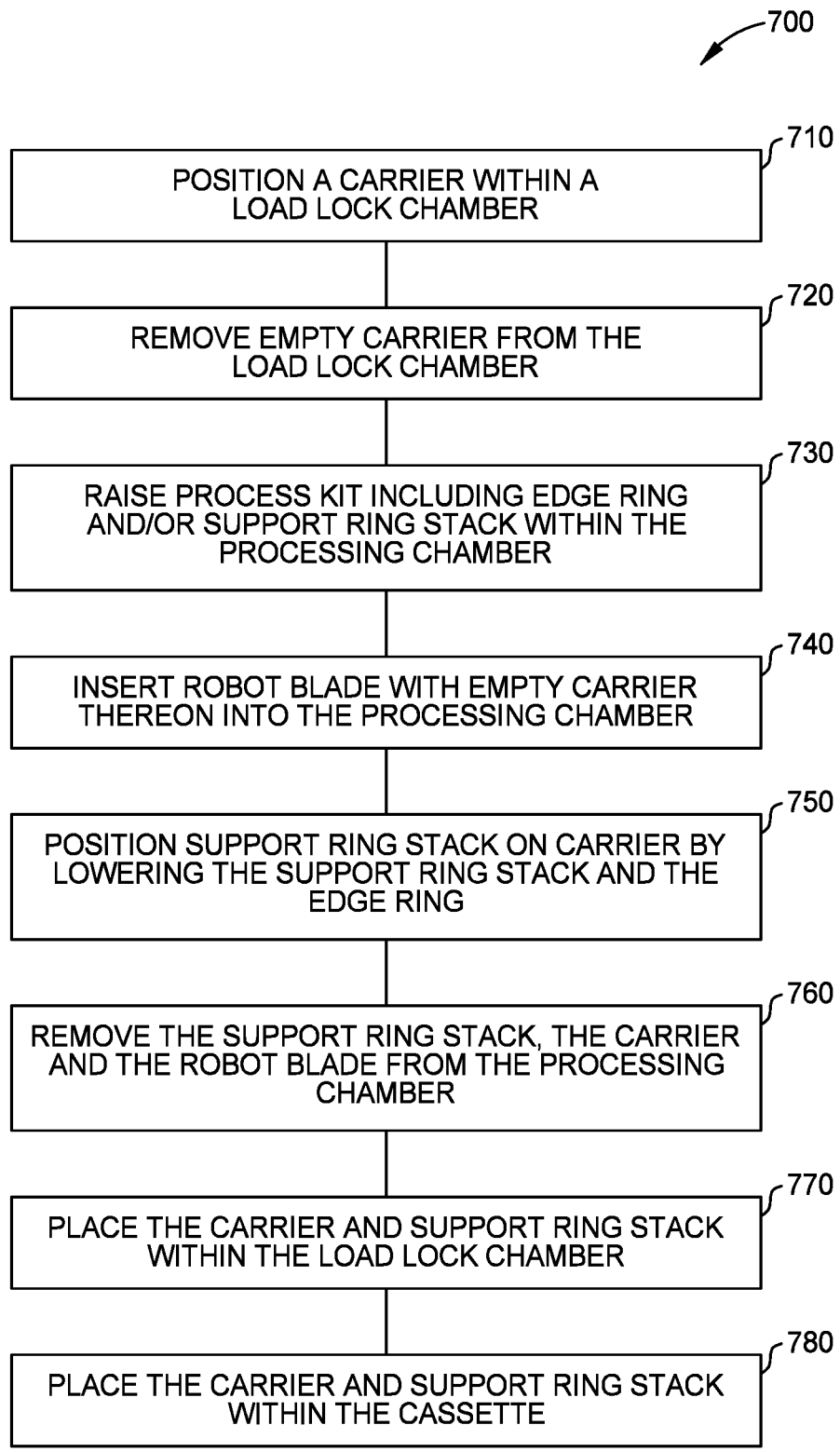
FIG. 7 illustrates a flow chart of a method, according to one or more implementations of the present disclosure.
Figure 8:
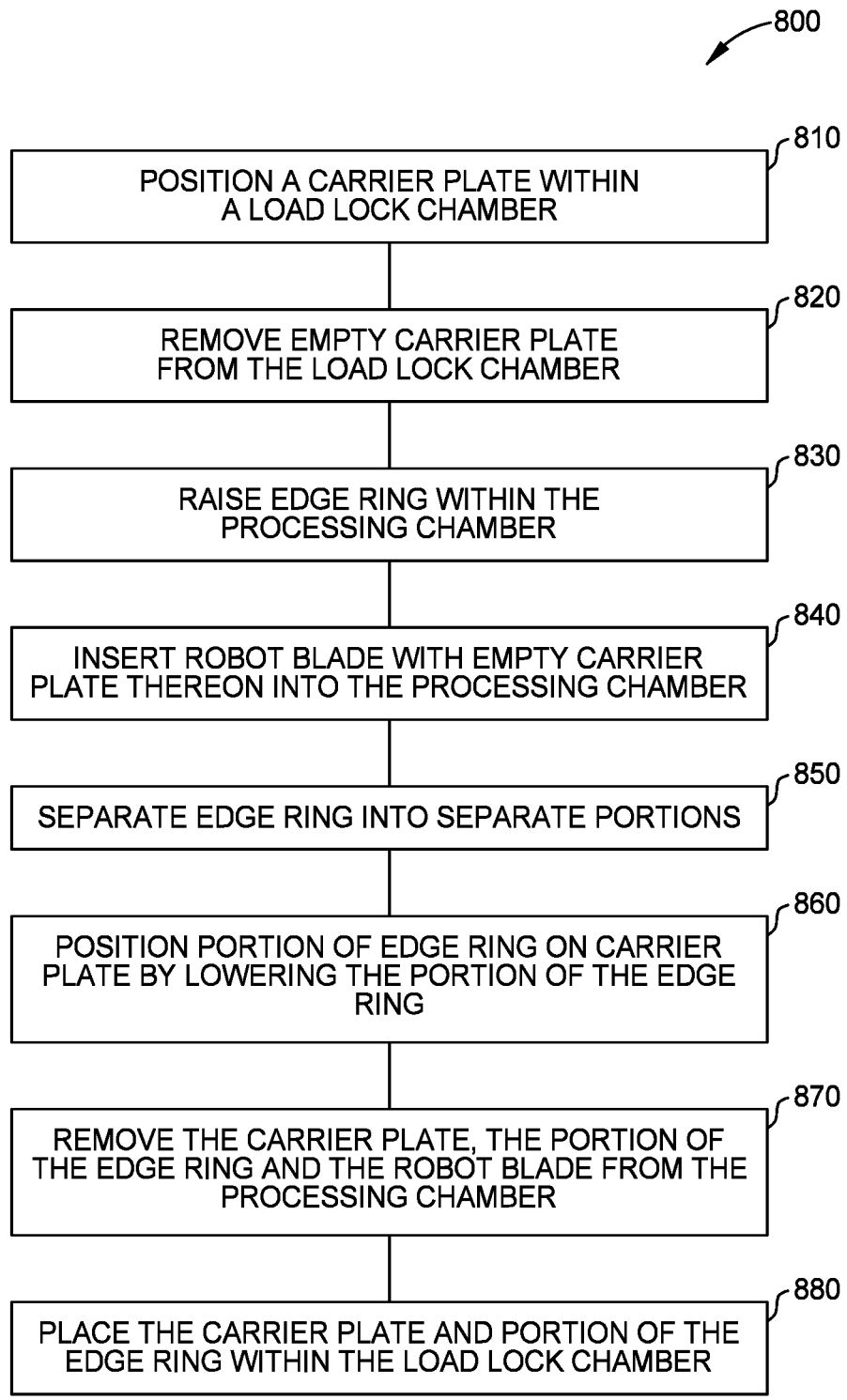
FIG. 8 illustrates a flow chart of a method, according to one or more implementations of the present disclosure.

FIG. 7 illustrates a flow chart of a method 700, according to one or more implementations of the present disclosure. The method 700 includes various operations performed during operation 650 according to examples described herein. FIG. 7 will be discussed in conjunction with FIGS. 1A-1J, 2, 3, and 5 to further describe the processes for removing the support ring stack of the process kit from the processing region 116 of the processing chamber 100 and storing the process kit in a storage unit, such as the cassette 502. The method 700 can be stored on and executed by a controller.

At operation 710, a factory interface robot 511, which is typically within an atmospheric pressure environment, positions an empty carrier ring, such as the carrier 184, within the load lock chamber 504. During this operation, the factory interface robot 511 will remove the empty carrier ring, which is positioned on a shelf (not shown) of a plurality of vertically spaced shelves (not shown) that are positioned within the cassette 502, and then deposit the empty carrier ring onto a support (not shown) positioned within the load lock chamber 504.

At operation 720, the transfer chamber robot 512 picks up the empty carrier ring, such that the empty carrier ring is positioned onto a robot blade 214 (shown in FIG. 2) coupled to the transfer chamber robot 512, and then removes the empty carrier ring from the load lock chamber 504. During operation 710 or operation 720, or even in between operation 710 and 720, the load lock chamber 504 is pumped down to a vacuum pressure that matches the pressure within the transfer chamber 506 in which the transfer chamber robot 512 is disposed. The equalization of pressure between the load lock chamber 504 and the transfer chamber 506 allows the transfer chamber robot 512 to access the load lock chamber 504 without causing a rush of gas, which can dislodge the carrier ring from the robot blade 214, and possibly allow contaminants to flow into the transfer chamber 506 from the load lock chamber 504 as a separating slit valve (not shown) is opened.

At operation 730, the process kit 104 including the multi-segment edge ring 110 and the support ring stack 130 is raised by the lift pins 180 to a raised position within the processing region 116 of the processing chamber 100. The raised position, as illustrated in FIG. 1C, is a distance above the top surface of the substrate support assembly 114.

At operation 740, the transfer chamber robot 512 inserts the robot blade 214, with the empty carrier ring, such as the carrier 184, disposed thereon, into the processing region 116 of the processing chamber 100 via the substrate access port 112. During operation 740, the transfer chamber robot 512 moves the robot blade 214 with the empty carrier 184 underneath the process kit 104.

At operation 750, the lift pins 180 lower the multi-segment edge ring 110 and the support ring stack 130 so that the support ring stack 130 is positioned on the carrier 184. The carrier 184 and the robot blade 214 thus fully support the used support ring stack 130.

At operation 760, the transfer chamber robot 512 removes the robot blade 214, the carrier 184, and the support ring stack 130 from the processing region 116 of the processing chamber 100 via the substrate access port 112.

At operation 770, the transfer chamber robot 512 places the carrier 184 and the support ring stack 130 on the support (not shown) positioned within the load lock chamber 504. During operation 770, one or more devices are used to unmount the carrier 184 and the support ring stack 130 from the robot blade 214, and the robot blade 214 is retracted from the load lock chamber 504. During operation 770, or after operation 770 is performed, the load lock chamber 504 is vented to an atmospheric pressure or a pressure that matches the pressure in the environment in which the factory interface robot 511 is disposed.

At operation 780, the factory interface robot 511 transfers the support ring stack 130 and the carrier 184 to one of the shelves positioned within the cassette 502. The consumable parts of the support ring stack 130 stored in the cassette 502, such as the inner ring 132 and the middle ring 134, which have been eroded during the processing of the first number of substrates, can be removed from the cassette 502 by a user. In some cases, the used support ring stack 130 is removed from the carrier 184 and replaced with a new support ring stack.

FIG. 8 illustrates a flow chart of a method 700, according to one or more implementations of the present disclosure. The method 800 includes various operations performed during operation 650 according to examples described herein. FIG. 8 will be discussed in conjunction with FIGS. 1A-1J, 2, 3, 4A-4F, and 5 to further describe the processes for removing the edge ring of the process kit from the processing region 116 of the processing chamber 100 and storing the edge ring in a storage unit, such as the cassette 502. The method 800 can be performed subsequent to the method 700. For example, the support ring stack 130 can be removed according to method 700 and the edge ring can be subsequently removed according to the method 800. The method 800 can be stored on and executed by a controller.

At operation 810, the factory interface robot 511, which is typically within an atmospheric pressure environment, positions an empty carrier plate, such as the carrier plate 200, within the load lock chamber 504. During this operation, the factory interface robot 511 will remove the empty carrier plate 200, which is positioned on a shelf (not shown) of a plurality of vertically spaced shelves (not shown) that are positioned within the cassette 502, and then deposit the empty carrier plate 200 onto a support (not shown) positioned within the load lock chamber 504.

At operation 820, the transfer chamber robot 512 picks up the empty carrier plate 200, such that the empty carrier plate 200 is positioned onto a robot blade 214 (shown in FIG. 2) coupled to the transfer chamber robot 512, and then removes the empty carrier plate 200 from the load lock chamber 504. During operation 810 or operation 820, or even in between operation 810 and operation 820, the load lock chamber 504 is pumped down to a vacuum pressure that matches the pressure within the transfer chamber 506 in which the transfer chamber robot 512 is disposed.

At operation 830, the multi-segment edge ring 110 is raised by the lift pins 180 to a raised position within the processing region 116 of the processing chamber 100. The raised position, as illustrated in FIG. 1H, is a distance above the top surface of the substrate support assembly 114.

At operation 840, the transfer chamber robot 512 inserts the robot blade 214, with the empty carrier plate 200 disposed thereon, into the processing region 116 of the processing chamber 100 via the substrate access port 112. During operation 840, the transfer chamber robot 512 moves the robot blade 214 with the empty carrier plate 200 underneath the multi-segment edge ring 110.

At operation 850, the multi-segment edge ring 110 is separated into separate segments for removal from the processing region 116.

At operation 860, the lift pins 180 lower the segment of the multi-segment edge ring 110 so that the segment of the edge ring is positioned on the carrier plate 200. The carrier plate 200 and the robot blade 214 thus fully support the segment of the multi-segment edge ring 110.

At operation 870, the transfer chamber robot 512 removes the robot blade 214 and the carrier plate 200 from the processing region 116 of the processing chamber 100 via the substrate access port 112.

At operation 880, the transfer chamber robot 512 places the carrier plate 200 and the segment of the multi-segment edge ring 110 on the support (not shown) positioned within the load lock chamber 504. During operation 880, one or more devices are used to unmount the carrier plate 200 and the segment of the multi-segment edge ring 110 from the robot blade 214, and the robot blade 214 is retracted from the load lock chamber 504. During operation 880, or after operation 880 is performed, the load lock chamber 504 is vented to an atmospheric pressure or a pressure that matches the pressure in the environment in which the factory interface robot 511 is disposed.

The factory interface robot 511 then transfers the segment of the multi-segment edge ring 110 and the carrier plate 200 to one of the shelves positioned within the cassette 502. Operations 810 to 880 can be repeated to remove additional segments of the multi-segment edge ring 110. The consumable segments of the multi-segment edge ring 110, which have been eroded during the processing of the first number of substrates, can be removed from the cassette 502 by a user. In some cases, the used segments of the multi-segment edge ring 110 are removed from the carrier plate 200 and are replaced with a new multi-segment edge ring.

Figure 9A:
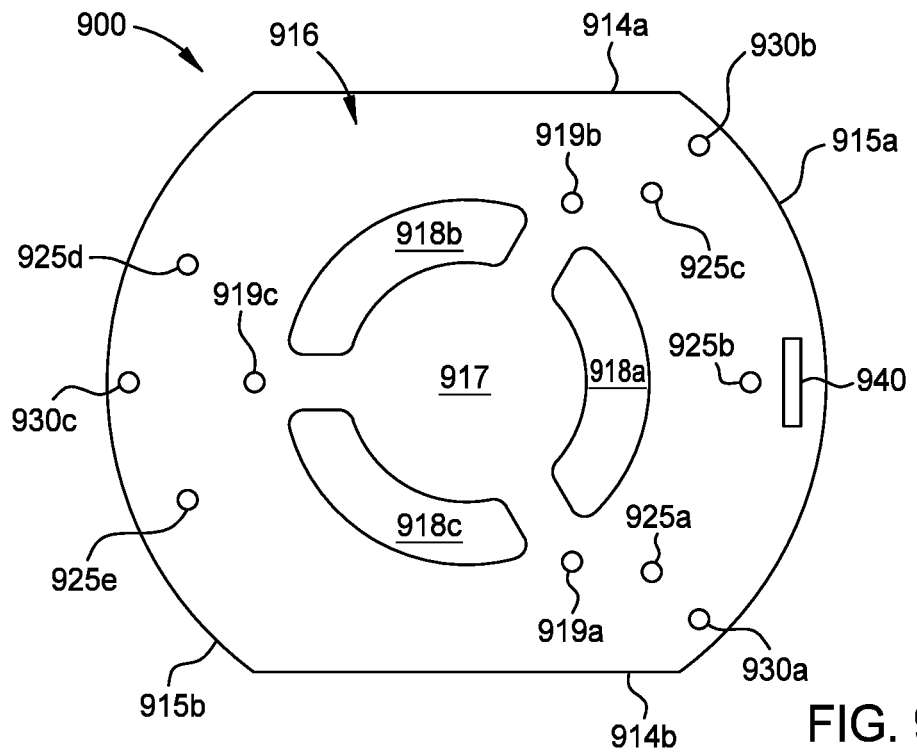
FIG. 9A illustrates a schematic top plan view of a carrier, according to one or more implementations of the present disclosure.
Figure 9B:
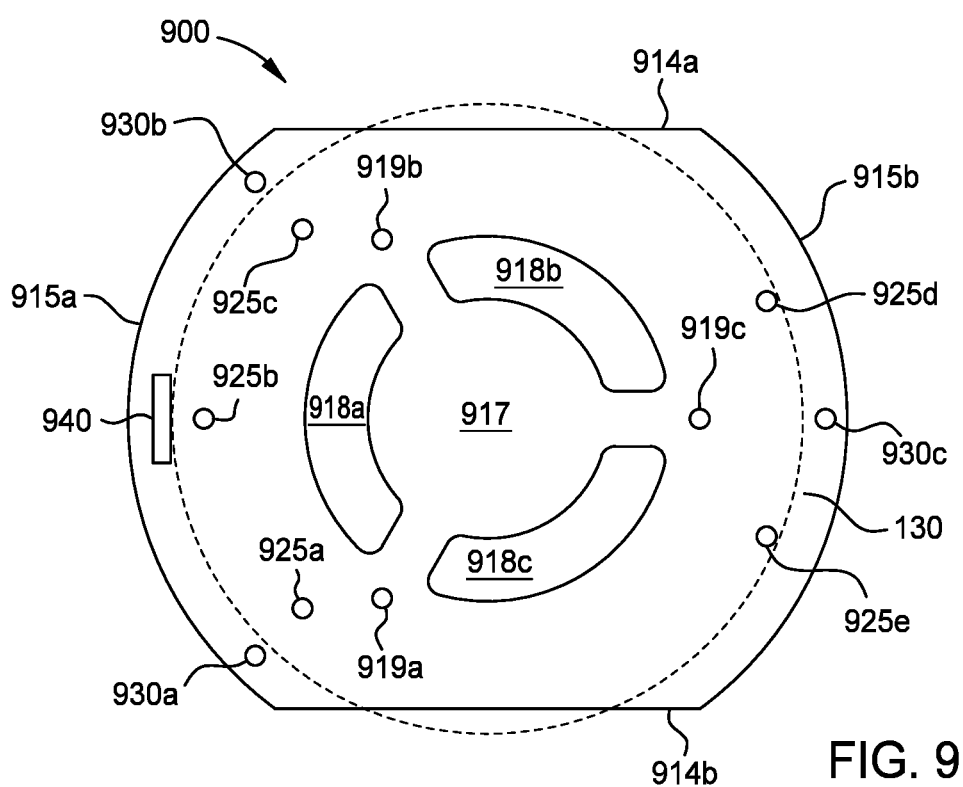
FIG. 9B illustrates a schematic bottom plan view of the carrier of FIG. 9A, according to one or more implementations of the present disclosure.

FIG. 9A illustrates a schematic top plan view of a carrier plate 900, according to one or more implementations of the present disclosure. FIG. 9B is a schematic bottom plan view of the carrier plate 900 of FIG. 9A. The carrier plate 900 is configured to remove a support ring stack, such as the support ring stack 130 from a processing chamber, such as the processing chamber 100. The carrier plate 900 can be used in place of the carrier 184 depicted in FIGS. 1D-1F. The carrier plate 900 is a semi-circular plate 916 having a perimeter defined by two parallel edges 914a, 914b and two opposing curved edges 915a, 915b coupling the two parallel edges 914a, 914b. The curved edges 915a, 915b facilitate lateral support of an edge ring positioned thereon, while the two parallel edges 914a, 914b allow the carrier plate 900 to be accommodated in processing chambers not originally designed to accommodate the carrier plate 900 therein. For example, the two parallel edges 914a, 914b can facilitate actuation of lift pins (such as lift pins 180) within a processing chamber without interfering with the carrier plate 900 while the carrier plate 900 is located within the processing chamber.

The semi-circular plate 916 includes a solid central region 917 and one or more semi-circular openings (three are shown) 918a-c (collectively 918) positioned concentrically around the solid central region 917. The semi-circular openings 918a-c facilitate a reduction in weight of the carrier plate 900, allowing the carrier plate 900 to be used on existing transfer equipment not originally designed to handle weights in excess of semiconductor wafer weights. In one example, the semi-circular plate 916 is formed from one or more materials including carbon fiber, graphite, silicon carbide, graphite-coated-silicon-carbide, silicon nitride, silicon oxide, alumina, and the like. Other materials are also contemplated.

The semi-circular plate 916 also includes a first plurality of receptacles 919a-c (collectively 919) disposed therein. The first plurality of receptacles 919 are sized and configured to receive a lift pin therein (such as lift pin 188) to facilitate actuation of the carrier plate 900 within a processing chamber. The first plurality of receptacles 919 are each located at the same radial distance from a center of the semi-circular plate 916. In one example, the first plurality of receptacles 919 are positioned at a radius greater than a radius of the semi-circular openings 918a-c.

Each of the receptacles 919 can be formed from one or more of a metal, silicon carbide, graphite, alumina, silicon nitride, silicon oxide, polyethylene terephthalate, or a ceramic material. Other materials are also contemplated. In one example, the receptacles 919 are formed from a soft polymer material, such as Vespel®, Ultem®, acetal, PTFE, or a ceramic material such as silicon carbide, to reduce particle generation.

The semi-circular plate 916 also includes a plurality of support pads 925a-e (collectively 925) (five are shown) for engaging with a supporting structure, such as a robot blade. Engagement of the support pads by the supporting structure reduces or prevents relative movement between the carrier plate 900 and the supporting structure during transfer of the carrier plate 900. For example, the supporting structure can include corresponding receptacles to receive the plurality of support pads 925.

Each of the support pads 925 can be formed from one or more of a metal, silicon carbide, graphite, alumina, silicon nitride, silicon oxide, polyethylene terephthalate, or a ceramic material. Other materials are also contemplated. In one example, the support pads 925 are formed from a soft polymer material, such as Vespel®, Ultem®, acetal, PTFE, or a ceramic material such as silicon carbide, to reduce particle generation.

The semi-circular plate 916 also includes a plurality of support features 930a-c (collectively 930) (three are shown) disposed therein. The support features 930 are each configured to support and align the support ring stack 130 on the carrier plate 900. The semi-circular plate 916 further includes an alignment feature 940 positioned along curved edge 915b. Although the alignment feature 940 is depicted as rectangular, other shapes are contemplated. Engagement of the alignment feature 940 and support features 930 by the support ring stack 130 reduces or prevents relative movement between the carrier 113 and the support ring stack 130 during transfer of the carrier 113.

Each of the support features 930 and the alignment feature 940 can be formed from one or more of a metal, silicon carbide, graphite, alumina, silicon nitride, silicon oxide, polyethylene terephthalate, or a ceramic material. Other materials are also contemplated. In one example the support features 930 and the alignment feature 940 are formed from a soft polymer material, such as Vespel®, Ultem®, acetal, PTFE, or a ceramic material such as silicon carbide, to reduce particle generation.

Implementations of the present disclosure can include one or more of the following potential advantages. Examples of the present disclosure result in increased plasma uniformity across the surface of a substrate being processed in a processing chamber resulting in reduced costs for fabricating a process kit. Since there is a direct correlation between plasma uniformity and process yield, the increased plasma uniformity leads to an increase in process yield. Furthermore, edge rings and support rings making use of the present disclosure are at least partially reusable and thus overall cost for plasma processing is reduced. Furthermore, loading new and removing used sets of rings from processing chamber without venting the chamber has a high business and economic impact to customers by improving system yield and reducing manual preventive maintenance and ring placement.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, such as, one or more computer programs tangibly embodied in a machine readable storage device, for execution by, or to control the operation of, data processing apparatus, for example, a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there can be additional elements other than the listed elements.

While the foregoing is directed to implementations of the present disclosure, other and further implementations of the disclosure can be devised without departing from the basic scope thereof, and the scope thereof is determined by the claims that follow.

What is claimed is:

1. A process kit for use in a processing chamber, comprising:
   a multi-segment edge ring, comprising:
      a first segment;
      a second segment; and
      a first annular body, comprising:
         a first upper surface, a first lower surface opposite the first upper surface, a first inner surface and a first outer surface, wherein
         the first segment and the second segment are connectable to form the first annular body,
         the first lower surface is operable to be positioned over a substrate support disposed within a processing chamber, and
         at least a portion of the first inner surface, which is positioned between the first upper surface and the first lower surface has a diameter greater than a diameter of a substrate to be processed in the processing chamber.

2. The process kit of claim 1, wherein at least a portion of the first outer surface, which is positioned between the first upper surface and the first lower surface has a diameter greater than a width of a substrate access port of the processing chamber in which the multi-segment edge ring is to be positioned.

3. The process kit of claim 1, wherein the first upper surface is a stepped surface having a radially inward portion and a radially outward portion, the radially outward portion being raised above the radially inward portion.

4. The process kit of claim 1, further comprising:
an inner ring comprising a second annular body having a second upper surface, a second lower surface, a second inner surface, and a second outer surface, wherein the second lower surface is positioned over at least a portion of the first upper surface of the multi-segment edge ring.

5. The process kit of claim 4, further comprising:
a middle ring comprising a third annular body having a planar upper surface, an planar lower surface parallel to the planar upper surface, a radially inner sidewall, and a radially outer sidewall, wherein at least a portion of the planar lower surface is positioned over at least a portion of the second upper surface of the inner ring.

6. The process kit of claim 1, wherein the first annular body comprises a material selected from silicon and silicon carbide.

7. A method of removing a multi-segment edge ring, comprising:
elevating the multi-segment edge ring from a position in which the multi-segment edge ring is disposed adjacent to a substrate support disposed within a processing chamber that is maintained at a vacuum pressure;
inserting a robot blade with a carrier plate disposed thereon into the processing chamber, wherein the robot blade is coupled to a transfer robot;
separating the multi-segment edge ring into segments comprising at least a first segment and a second segment;
transferring the first segment of the multi-segment edge ring onto the carrier plate; and
removing the first segment of the multi-segment edge ring and the carrier plate from the processing chamber by use of the transfer robot, while the processing chamber is maintained at the vacuum pressure.

8. The method of claim 7, further comprising:
removing the first segment of the multi-segment edge ring from the carrier plate;
inserting the robot blade with the carrier plate disposed thereon into the processing chamber;
transferring the second segment of the multi-segment edge ring onto the carrier plate; and
removing the second segment of the multi-segment edge ring and the carrier plate from the processing chamber by use of the transfer robot, wherein the first segment and the second segment are connectable to form an annular body of the multi-segment edge ring.

9. The method of claim 7, wherein the multi-segment edge ring has an outer diameter greater than a substrate access port of the processing chamber through which the multi-segment edge ring is passed.

10. The method of claim 7, wherein separating the multi-segment edge ring into segments comprises contacting the multi-segment edge ring with the carrier plate to separate the multi-segment edge ring.

11. The method of claim 7, further comprising unmounting the multi-segment edge ring and the carrier plate from the robot blade, wherein the unmounting occurs in a load lock chamber.

12. The method of claim 11, further comprising placing the multi-segment edge ring and the carrier plate within storage positioned external to the load lock chamber and the processing chamber.

13. The method of claim 11, wherein the carrier plate comprises:

a polygonal body;
a support surface;
a bottom surface opposing the support surface;
sidewalls extending from the support surface to the bottom surface, wherein the support surface, the bottom surface, and the sidewalls define the polygonal body; and
a plurality of fingers extending from the polygonal body, wherein each finger provides a contact point operable to support a segment of the of the multi-segment edge ring.

14. A method of removing a process kit, comprising:
elevating a multi-segment edge ring and a support ring stack from a position in which the support ring stack is disposed over a surface of a substrate support disposed within a processing chamber, where a bottom surface of the support ring stack is positioned over at least a portion of a top surface of the multi-segment edge ring;
inserting a robot blade with a carrier ring disposed thereon into the processing chamber, wherein the robot blade is coupled to a transfer robot;
transferring the support ring stack onto the carrier ring;
removing the support ring stack, the carrier ring, and the robot blade from the processing chamber by use of the transfer robot;
inserting the robot blade with a carrier plate disposed thereon into the processing chamber;
separating the multi-segment edge ring into segments comprising at least a first segment and a second segment;
transferring the first segment of the multi-segment edge ring onto the carrier plate; and
removing the first segment of the multi-segment edge ring and the carrier plate from the processing chamber by use of the transfer robot.

15. The method of claim 14, further comprising:
removing the first segment of the multi-segment edge ring from the carrier plate;
inserting the robot blade with the carrier plate disposed thereon into the processing chamber;
transferring the second segment of the multi-segment edge ring onto the carrier plate; and
removing the second segment of the multi-segment edge ring and the carrier plate from the processing chamber by use of the transfer robot.

16. The method of claim 15, wherein the first segment and the second segment are connectable to form an annular body of the multi-segment edge ring.

17. The method of claim 16, wherein the support ring stack comprises a first ring and a second ring disposed over the first ring.

18. The method of claim 14, wherein the multi-segment edge ring has an outer diameter greater than a substrate access port of the processing chamber in which the multi-segment edge ring is positioned.

19. The method of claim 18, wherein separating the multi-segment edge ring into segments comprises contacting the multi-segment edge ring with the carrier plate to separate the multi-segment edge ring.

20. The method of claim 19, wherein the carrier plate comprises:
a polygonal body;
a support surface;
a bottom surface opposing the support surface;

sidewalls extending from the support surface to the bottom surface, wherein the support surface, the bottom surface, and the sidewalls define the polygonal body; and a plurality of fingers extending from the polygonal body, wherein each finger provides a contact point operable to support a segment of the of the multi-segment edge ring.

* * * * *